(12) United States Patent
Sakai et al.

(10) Patent No.: US 7,667,252 B2
(45) Date of Patent: Feb. 23, 2010

(54) SEMICONDUCTOR NONVOLATILE STORAGE ELEMENT AND METHOD OF FABRICATING THE SAME

(75) Inventors: Shigeki Sakai, Tsukuba (JP); Kazuo Sakamaki, Tokyo (JP)

(73) Assignees: National Institute of Advanced Industrial Science and Technology, Tokyo (JP); SEIKO NPC Corporation, Tokyo (JP)

( * ) Notice: Subject to any disclaimer, the term of this patent is extended or adjusted under 35 U.S.C. 154(b) by 201 days.

(21) Appl. No.: 11/634,042

(22) Filed: Dec. 5, 2006

(65) Prior Publication Data

US 2008/0001194 A1    Jan. 3, 2008

Related U.S. Application Data

(60) Continuation of application No. 10/860,752, filed on Jun. 2, 2004, now abandoned, which is a division of application No. 10/090,851, filed on Mar. 4, 2002, now Pat. No. 6,784,473.

(30) Foreign Application Priority Data

Mar. 27, 2001   (JP)   ............................... 2001-90509

(51) Int. Cl.
 *H01L 29/76*    (2006.01)

(52) U.S. Cl. ............... 257/295; 257/301; 257/300; 257/E27.104

(58) Field of Classification Search ............. 257/295, 257/301, 300, E27.104
See application file for complete search history.

(56) References Cited

U.S. PATENT DOCUMENTS

| | | | | |
|---|---|---|---|---|
| 5,384,729 | A * | 1/1995 | Sameshima | 365/145 |
| 6,531,781 | B2 * | 3/2003 | Tseng | 257/770 |
| 6,642,563 | B2 * | 11/2003 | Kanaya | 257/296 |
| 6,784,473 | B2 * | 8/2004 | Sakai et al. | 257/295 |

* cited by examiner

*Primary Examiner*—Eugene Lee
(74) *Attorney, Agent, or Firm*—Jordan and Hamburg LLP

(57) ABSTRACT

To provide a semiconductor nonvolatile storage device capable of applying distributed voltage efficiently to a ferroelectric capacitor in a semiconductor nonvolatile storage device having an MFMIS structure without enlarging a memory cell area and a method of fabricating the same, a ferroelectric nonvolatile storage element is constructed by a structure successively laminated with a first insulator layer (3), a first conductor layer (4), a ferroelectric layer (5) and a second conductor layer (6) on a channel region and is constructed by a structure having a third conductor (9) and a fourth conductor (10) respectively laminated on a source region and a drain region, in which the third conductor (9) and the fourth conductor (10) are opposed to each other via the first conductor layer (4) and a second insulator thin film (11).

18 Claims, 20 Drawing Sheets

PRIOR ART

SEMICONDUCTOR NONVOLATILE STORAGE ELEMENT AND METHOD OF FABRICATING THE SAME

BACKGROUND OF THE INVENTION

1. Field of the Invention

The present invention relates to a field effect transistor type ferroelectric nonvolatile storage element using a ferroelectric body at a control gate and a method of fabricating the same.

2. Description of the Related Art

As a field effect transistor type ferroelectric nonvolatile storage element using a ferroelectric body at a control gate, there is MFS-FET (Metal-Ferroelectric-Semiconductor-field effect transistor) (or conductor layer-ferroelectric layer-semiconductor-field effect transistor) having a constitution of replacing an oxide film constituting an insulating layer of normal MOS-FET (Metal Oxide Semiconductor-Field Effect Transistor) (or conductor layer-oxide film-semiconductor-field effect transistor) by a ferroelectric body. According to the MFS-FET type memory, there is provided a method in which polarization of a ferroelectric body changes threshold voltage of the transistor and a change in resistance of a channel between a source and a drain is read as a change in the magnitude of a drain current value. According to the system, there is constituted so-to-speak nondestructive reading in which information is not destructed by reading operation at low voltage since ON/OFF of FET (field effect transistor) is maintained by holding residual polarization of the ferroelectric body.

A field effect ferroelectric memory transistor (MFS-FET) arranging a ferroelectric body at a control gate is classified into two kinds in gross classification. One of them is a ferroelectric transistor having a structure of MFIS (Metal-Ferroelectric-Insulator-Semiconductor) (or conductor layer-ferroelectric layer-insulator layer-semiconductor), in which an insulating layer (I) is sandwiched between a ferroelectric layer (F) and a semiconductor (S) of an MFS structure. The ferroelectric body induces electric charge at a surface of a semiconductor substrate via a gate insulating layer by polarization thereof.

Other thereof is a ferroelectric transistor having a structure of MFMIS (Metal-Ferroelectric-Metal-Insulator-Semiconductor) (or conductor layer-ferroelectric layer-conductor layer-insulating layer-semiconductor) as a gate structure, in which a conductor layer (M) (or referred to as floating gate) is sandwiched between a ferroelectric layer (F) and an insulating layer (I) of an MFIS structure. The present invention relates to the latter of the MFMIS structure.

Further, a conductor layer (M) described in the specification includes a conductor of polycrystal silicon (polysilicon, Poly-Si), an alloy of a metal and polycrystal silicon or the like other than a metal and a laminate thereof.

According to a conventional MFMIS type ferroelectric memory, as shown by FIG. 12A, there are formed a source region and a drain region by interposing a channel region on a semiconductor substrate (S), a main face of the middle channel region of the semiconductor substrate (S) is laminated with a silicon oxide layer ($SiO_2$) frequently used in a semiconductor process as a gate insulator layer (I), polysilicon (Poly-Si) is laminated thereon as a first conductor layer (M), $Ir/IrO_2$ (iridium/iridium oxide) is laminated further thereon as a barrier layer for preventing mutual diffusion between a ferroelectric material and Poly-Si, a ferroelectric thin layer (F), for example, PZT ($PbZr_xTi_{1-x}O_3$) is laminated thereon and as a gate electrode, $Ir/IrO_2$ is laminated thereon as a second conductor layer (M). FIG. 12A shows the laminated structure as a gate portion formed by carrying out lithography and etching. (A reference: T. Nakamura et al. Dig. Tech. Pap. of 1995 IEEE Int. Solid State Circuits Conf. p. 68 (1995))

FIG. 12B shows the MFMIS structure of FIG. 12A by an equivalent circuit and a capacitance ($C_F$) of a ferroelectric capacitor and a capacitance ($C_I$) of a gate insulator capacitor are connected in series. In FIG. 12B, when the ferroelectric layer is polarized by applying voltage between an upper electrode A and a semiconductor substrate B, it is necessary to apply the voltage until polarization of the ferroelectric body is sufficiently saturated in view of a memory holding characteristic.

Voltage distributed to the ferroelectric capacitor is dependent on a coupling ratio ($C_I/(C_I+C_F)$) between the capacitance ($C_F$) of the ferromagnetic capacitor and the capacitance ($C_I$) of the gate insulator capacitor.

In order to enlarge the voltage distributed to the ferroelectric capacitor, it is important to design such that the capacitance ($C_I$) of the gate insulating capacitor becomes larger than the capacitance ($C_F$) of the ferroelectric capacitor.

Hence, in order to design to make the capacitance ($C_I$) of the gate insulator capacitor larger than the capacitance ($C_F$) of the ferroelectric capacitor, it is conceivable to thin the gate insulating film and thicken the ferroelectric thin film, however, there is a limit in thinning the gate insulating film in view of withstand voltage and leakage current. Further, when the ferroelectric thin film is thickened, high drive voltage is needed to saturate polarization of the ferroelectric body.

A conventional method for making the capacitance ($C_I$) of the gate insulator capacitor larger than the capacitance ($C_F$) of the ferroelectric capacitor while avoiding these problems, is a method of changing areas of the capacitance $C_F$ and the capacitance $C_I$. FIG. 12C shows a simple schematic sectional view of carrying out the method. FIG. 12D shows a plain view viewing FIG. 12C from above. There is provided an MFMIS structure having a ferroelectric layer only at portion of an area of an MIS (conductor-insulator-semiconductor) portion for constituting $C_I$. $C_I$ can be designed to be larger than $C_F$ as necessary by the conventional method.

However, according to the conventional method, in order to apply large distributed voltage on the ferroelectric capacitor, there is adopted the method of planarly enlarging the area of the MIS capacitor relative to the area of the MFM capacitor and therefore, as shown by FIG. 12D, even when the MFMIS portion is formed by a minimum fabrication dimension, the MIS portion is as large as an amount of an area ratio of the MIS portion and the MFMIS portion, as a result, a large area is occupied and there poses a problem that a high integration degree cannot be achieved.

SUMMARY OF THE INVENTION

Hence, the invention has resolved such an unresolved problem of the conventional technology. It is an object of the invention to provide a highly reliable transistor type ferroelectric nonvolatile storage element capable of realizing high density integrated formation by reducing a memory cell area.

In order to achieve the above-described object, according to a first aspect of the invention, there is provided a semiconductor nonvolatile storage element which is a ferroelectric nonvolatile storage element including a field effect transistor wherein the field effect transistor includes a structure successively laminated with a first insulator layer, a first conductor layer, a ferroelectric layer and a second conductor layer on a channel region of a semiconductor substrate, the field effect transistor includes a third conductor layer and a fourth conductor respectively formed on a source region and a drain region on both sides of the channel region of the semiconductor substrate, further comprising a second insulator thin film between the third conductor and the fourth conductor and the first conductor layer.

By constituting in this way, according to the first aspect of the invention, there is constructed a constitution in which a capacitor of an MIM structure constituted by the first conductor layer, the second insulator thin film and the third and the fourth conductors, is connected in parallel with a capacitor of an MIS structure constituted by the first conductor layer, the first insulator layer and the semiconductor substrate and accordingly, an effective area of the MIS structure can be increased and an electrostatic capacitance $C_I$ of a composite capacitor thereof can be increased.

Thereby, even when capacitor areas of the MFM structure and the MIS structure are provided with the same occupied area on a silicon main face, an effective area of the MIS structure can be made larger than an effective area of an MFM structure. Therefore, a coupling ratio ($C_I/(C_I+C_F)$) of an electrostatic capacitance $C_F$ of the capacitor of the MFM structure to the composite electrostatic capacitance $C_I$ of the capacitor of the MIS structure and the capacitor of the MIM structure, can be increased without increasing the memory cell area as compared with related art example. Distributed voltage can efficiently be applied to a ferroelectric capacitor.

In this way, the effective area of the MIS capacitor laminated in an up and down direction substantially within the same area, can be made larger than the effective area of the MFM capacitor without increasing the occupied area. As a result, high density integrated formation can be realized by reducing the memory cell area and a highly reliable transistor type ferroelectric nonvolatile storage element can be provided.

According to a second aspect of the invention, there is provided the semiconductor nonvolatile storage element according to the first aspect wherein recesses and projections are included at a side wall of the first conductor layer opposed to the third and the fourth conductors and/or side walls of the third and the fourth conductors opposed to the first conductor layer.

By constituting in this way, according to the second aspect of the invention, the capacitance of the MIM structure is increased by increasing a surface area thereof by providing the recesses and the projections at the side walls of the third and the fourth conductors and the first conductor layer opposed thereto via the second insulator thin film. By constituting in this way, the effective area of the MIS structure can further be increased.

Therefore, although the capacitor areas of the MFM structure and the MIS structure are provided with the same occupied area on the silicon main face, the effective area of the MIS structure can be made further larger than the effective area of the MFM structure. Therefore, the coupling ratio ($C_I/(C_I+C_F)$) of the electrostatic capacitance $C_F$ of the capacitor of the MFM structure and the composite electrostatic capacitance $C_I$ of the capacitor of the MIS structure and the capacitor of the MIM structure, can further be increased without increasing the memory cell area as compared with related art example and the distributed voltage can efficiently be applied to the ferroelectric capacitor.

According to a third aspect of the invention, there is provided the semiconductor nonvolatile storage element according to the first or the second aspect wherein the semiconductor substrate is an SOI (Silicon On Insulator) substrate.

By constituting in this way, according to the third aspect of the invention, the field effect semiconductor device is constituted on silicon above the insulating substrate and therefore, a parasitic capacitance between the source and the drain and the silicon substrate is reduced and a high-speed transistor type ferroelectric nonvolatile storage element with low power consumption can be provided.

According to a fourth aspect of the invention, there is provided the semiconductor nonvolatile storage element according to any one of the first through the third aspects wherein an area of the second conductor layer above the ferroelectric layer is made smaller than an area of the ferroelectric layer.

By constituting in this way, the effective area of the MIS structure can relatively made larger than the effective area of the MFM structure. Therefore, the coupling ratio ($C_I/(C_I+C_F)$) of the electrostatic capacitance $C_F$ of the capacitor of the MFM structure and the composite electrostatic capacitance $C_I$ of the capacitor of the MIS structure and the capacitor of the MIM structure can further be increased and the distributed voltage can efficiently be applied to the ferroelectric capacitor.

According to a fifth aspect of the invention, there is provided the semiconductor nonvolatile storage element according to any one of the first aspect through the fourth aspects wherein the second conductor layer is disposed above an element isolating region of the semiconductor substrate.

By constituting in this way, an increase in a degree of freedom of wiring can be achieved by disposing the second conductor layer at the element isolating region and accordingly, highly integrated formation of the semiconductor nonvolatile storage element can further be promoted.

According to a sixth aspect of the invention, there is provided the semiconductor nonvolatile storage element according to any one of the first aspect through the fifth aspects wherein each of the first insulator layer and the second insulator thin film comprises a layer of one material or a layer laminated with two or more of materials selected from a group consisting of $SiO_2$ (silicon oxide), SiN (silicon nitride), SiON (silicon oxynitride), $SiO_2$—SiN (ON film: silicon oxide-silicon nitride), $SiO_2$—SiN—$SiO_2$ (ONO film: silicon oxide-silicon nitride-silicon oxide), $Ta_2O_5$, $SrTiO_3$, $TiO_2$, $(Ba,Sr)TiO_3$, $Al_2O_3$, $ZrO_2$, $HfO_2$, $Y_2O_3$, $CeO_2$, $CeZrO_2$ and YSZ (yttrium oxide stabilized zirconium oxide).

According to a seventh aspect of the invention, there is provided the semiconductor nonvolatile storage element according to any one of the first through the sixth aspects wherein the ferroelectric layer is a layer of one material selected from a group consisting of $SrBi_2Ta_2O_9$, $PbTiO_3$, $PbZr_xTi_{1-x}O_3$, $Pb_yLa_{1-y}Zr_xTi_{1-x}O_3$, $Bi_4Ti_3O_{12}$, $SrNbO_7$, $Pb_5Ge_3O_{11}$ and $Sr_2Ta_xNb_{1-x}O_7$.

According to an eighth aspect of the invention, there is provided a method of fabricating a semiconductor nonvolatile storage element which is a method of fabricating the semiconductor nonvolatile storage element according to the first aspect, the method comprising (a) a step of forming a dummy gate above a portion of a semiconductor substrate including a channel region, (b) a step of integrally depositing a third and a fourth conductor above the semiconductor substrate and above the dummy gate, (c) a step of flattening the third and the fourth conductors, (d) a step of forming a source region and a drain region at the semiconductor substrate, (e) a step of exposing the portion of the semiconductor substrate by removing the dummy gate, (f) a step of forming an insulator thin film above the exposed portion of the semiconductor substrate, above side walls of the third and the fourth conductors and above the third and the fourth conductors, (g) a step of successively laminating a first conductor layer, a ferroelectric layer and a second conductor layer above the insulator thin film, and (h) a step of patterning the second conductor layer and the ferroelectric layer and the first conductor layer and etching to form the second conductor layer, the ferroelectric layer and the first conductor layer.

According to the fabricating method of the eighth aspect of the invention, there is constructed a constitution in which a capacitor of the MIM structure constituted by the first conductor layer, the second insulator thin film, the third conductor layer and the fourth conductor layer, is connected in parallel with the capacitor of the MIS structure constituted by the first conductor layer, the first insulator layer and the semiconductor substrate, the effective area of the MIS structure can be increased and the electrostatic capacitance $C_I$ of the composite capacitor can be increased.

In this way, by providing the MFM structure formed by the second insulator thin film and the third and the fourth conductors at the side wall of the first conductor layer, the effective area of the total capacitor $C_I$ of a buffer layer can be made larger than the effective area of the MFM capacitor. Therefore, according to the fabricating method, in comparison with the conventional example, the coupling ratio ($C_I/(C_I+C_F)$) of the electrostatic capacitor $C_F$ of the MFM capacitor and the composite electrostatic capacitance $C_I$ of the MIS capacitor and the MIM capacitor can be increased without increasing the memory cell area and the distributed voltage can efficiently be applied to the ferroelectric capacitor.

In this way, the area of the MIS capacitor laminated in the up and down direction substantially in the same area, can be made larger than the area of the MFM capacitor without increasing the occupied area and as a result, integrated formation can be realized at high density by reducing the memory cell area and the highly reliable transistor type ferroelectric nonvolatile storage element can be provided.

Further, according to the fabricating method, when the ferroelectric layer is formed at step (g), since the semiconductor substrate is not exposed, there is achieved an advantage that the device characteristic is prevented from being deteriorated by isolating an impurity included in the ferroelectric body and diffusing the impurity into the semiconductor substrate.

Further, normally, a source and a drain region is formed by forming a gate portion and thereafter implanting ions to a semiconductor substrate and subjecting the semiconductor substrate to an annealing, however, there is a concern of damaging a side wall of a ferroelectric thin film by implanting ions. Further, there is a concern of contaminating silicon by the ferroelectric body in the annealing. In contrast thereto, according to the fabricating method of the invention, the ferroelectric capacitor is formed after forming the source and the drain and therefore, there is an advantage that there is not a problem of damaging the side wall or contaminating the ferroelectric body.

According to a ninth aspect of the invention, there is provided a method of fabricating a semiconductor nonvolatile storage element which is a method of fabricating the semiconductor nonvolatile storage element according to the first aspect, the method comprising (a) a step of successively laminating a first insulator layer, a first conductor layer and an insulating layer for constituting a hard mask above a semiconductor substrate, a step of etching to form the insulating layer for constituting the hard mask, the first conductor layer and the first insulator layer in a predetermined pattern and a step of forming a source region and a drain region at the semiconductor substrate, (b) a step of forming a second insulator thin film at side walls of the first insulator layer, the first conductor layer and the insulating film, (c) a step of integrally depositing a third and a fourth conductor above the semiconductor substrate, above the insulating film, above the second insulator thin film and above a side wall of the second insulator thin film, (d) a step of flattening the third and the fourth conductors, (e) a step of forming an insulating layer above the third and the fourth conductors and a step of removing the insulating film for constituting the hard mask, (f) a step of successively laminating a ferroelectric layer and a second conductor layer above the insulating layer above the third and the fourth conductors and above the first conductor layer, and (g) a step of etching to form the second conductor layer and the ferroelectric layer by patterning the second conductor layer and the ferroelectric layer.

According to the fabricating method of the ninth aspect of the invention, by providing the MIM structure formed by the second insulator thin film and the third and the fourth conductors at the side wall of the first conductor layer, the effective area of the total capacitor $C_I$ of the buffer layer can be made larger than the effective area of the MFM capacitor. Therefore, according to the fabricating method, in comparison with the conventional example, the coupling ratio ($C_I/(C_I+C_F)$) of the electrostatic capacitance $C_F$ of the MFM capacitor and the composite electrostatic capacitance $C_I$ of the MIS capacitor and the MIM capacitor, can be increased without increasing the memory cell area and the distributed voltage can efficiently be applied to the ferroelectric capacitor.

Further, when an impurity is implanted to the source region and the drain region formed at step (a) by utilizing the second insulator thin film formed at the step (b) as a spacer, an LDD (Lightly Doped Drain) structure can be formed.

According to a tenth aspect of the invention, there is provided a method of fabricating a semiconductor nonvolatile storage element which is a method of fabricating the semiconductor nonvolatile storage element according to the second aspect, the method comprising (a) a step of successively laminating a first insulator layer, a first conductor layer and an insulating layer for constituting a hard mask above a semiconductor substrate, a step of etching to form the insulating layer for constituting the hard mask and the first conductive layer in a predetermined pattern and a step of forming a source region and a drain region at the semiconductor substrate, (b) a step of forming recesses and projections at a side wall of the first conductor layer and a step of forming a second insulator thin film above the recesses and projections, (c) a step of removing the first insulator layer above the source region and above the drain region, (d) a step of integrally depositing a third and a fourth conductor above the semiconductor substrate, above the insulating film for constituting the hard mask, above the second insulator thin film and above a side wall of the second insulator thin film, (e) a step of flattening the third and the fourth conductors, (f) a step of forming an insulating layer above the third and the fourth conductors, (g) a step of removing the insulating film for constituting the hard mask, (h) a step of laminating a ferroelectric layer and a second conductor layer above the insulating layer and the first conductor layer, and (i) a step of etching to form the ferroelectric layer and the second conductor layer by patterning the ferroelectric layer and the second conductor layer.

According to the fabricating method of the tenth aspect of the invention, there is provided the MIM structure formed by the side wall of the first conductor layer and the second insulator thin film and the third and the fourth conductors and increasing the surface area by forming very small recesses and projections at the surface of the side wall of the first conductor layer. That is, according to the fabricating method, the capacitance of the MIM structure is increased by increasing the surface area by recesses and projections of the side wall of the first conductor layer at step (b) to thereby further increase the effective area of the MIS structure. As a result, the effective area of the total capacitor $C_I$ of the buffer layer can be made larger than the effective area of the MFM capacitor. Therefore, according to the fabricating method, in comparison with the related art example, the coupling ratio ($C_I$/($C_I+C_F$)) of the electrostatic capacitance $C_F$ of the MFM capacitor and the composite electrostatic capacitance $C_I$ if the MIS capacitor and the MIM capacitor can be increased without increasing the memory cell area and the distributed voltage can efficiently be applied to the ferroelectric capacitor.

According to an eleventh aspect of the invention, there is provided the method of fabricating a semiconductor nonvolatile storage element according to the tenth aspect wherein the (h) step includes a step of laminating a barrier layer above the insulating layer and above the first conductor layer before the step of laminating the ferroelectric layer and in the (i) step, the barrier layer is also etched to form by patterning the barrier layer.

According to the fabricating method of the eleventh aspect of the invention, the barrier layer can prevent movement of the impurity of the ferroelectric layer thereabove to the semiconductor substrate and stability of operation of the element can be maintained.

According to a twelfth aspect of the invention, there is provided a method of fabricating a semiconductor nonvolatile storage element which is a method of fabricating the semiconductor nonvolatile storage element according to the third aspect, the method comprising (a) a step of successively laminating an insulating layer and a dummy gate material above a semiconductor substrate, a step of etching to form the dummy gate and the insulating layer in a predetermined pattern and a step of forming a source region and a drain region, (b) a step of integrally depositing a third and a fourth conductor above the semiconductor substrate and above the dummy gate and a step of flattening the third and the fourth conductors, (c) a step of removing the dummy gate, (d) a step of removing the insulating layer and forming recesses and projections at side walls of the third and the fourth conductors, (e) a step of forming a first insulator layer above the semiconductor substrate and forming a second insulator thin film above the third and the fourth conductor layers and above the recesses and the projections of the sidewalls of the third and the fourth conductors, (f) a step of successively laminating a first conductor layer and a ferroelectric layer and a second conductor layer above the first insulator layer and above the second insulator thin film, and (g) a step of etching to form the second conductor layer, the ferroelectric layer and the first conductor layer by patterning the second conductor layer, the ferroelectric layer and the first conductor layer.

According to the fabricating method of the twelfth aspect of the invention, the effective area of the total capacitor $C_I$ of the buffer layer can be made larger than the effective area of the MFM capacitor by increasing the surface area by forming very small recesses and projections at the surfaces of the side walls of the third and the fourth conductors and forming the MIM structure by the side walls of the third and the fourth conductors and the second insulator thin film and the first conductor layer and connecting the MIM structure in parallel with the MIS structure. Therefore, according to the fabricating method, in comparison with the conventional example, the coupling ratio ($C_I$/($C_I+C_F$)) of the electrostatic capacitance $C_F$ of the MFM capacitor and the composite electrostatic capacitance $C_I$ of the MIS capacitor and the MIM capacitor, can be increased without increasing the memory cell area and the distributed voltage can efficiently be applied to the ferroelectric capacitor.

DETAILED DESCRIPTION OF THE PREFERRED EMBODIMENTS

A detailed explanation will be given of the invention in line with preferred embodiments shown in the attached drawings as follows. Further, the respective drawing only shows an outline of a size, a constitution and an arrangement relationship to a degree of capable of understanding the invention. Further, a numerical value, a process condition, a material or the like described below is simply an example. Therefore, the invention is not limited by any of the exemplifying embodiments.

First Embodiment

Figure 1:
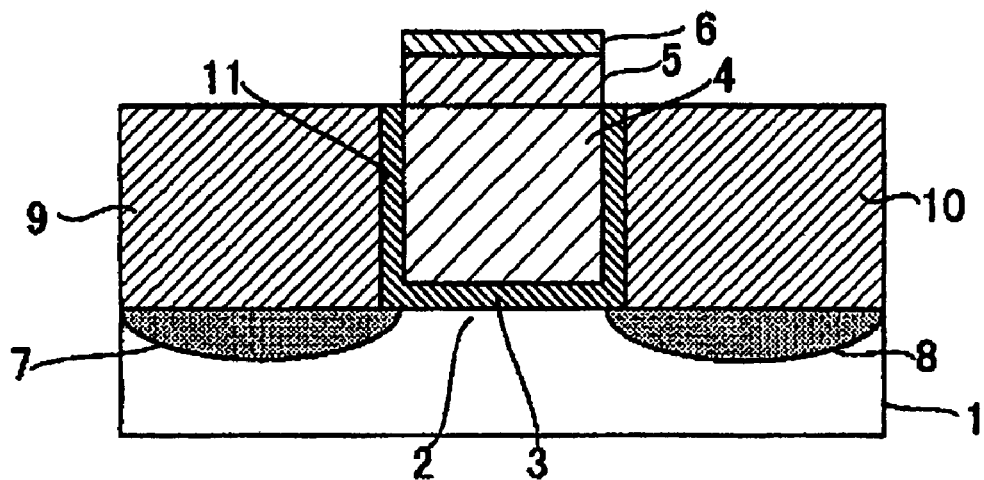
FIG. 1 is a sectional view showing a constitution of a semiconductor nonvolatile storage element according to a first embodiment of the invention.

FIG. 1 is a sectional view of an outline of a constitution of a semiconductor nonvolatile storage element according to a first embodiment of the invention. As shown by FIG. 1, according to the embodiment, above a channel region 2 of a silicon semiconductor (S) substrate 1, there is provided a gate portion of an MFMIS structure successively laminated with a first insulating layer (I) 3 of silicon dioxide/a first conductor layer (M) 4 of polysilicon (a barrier layer of $IrO_2$ may be included on polysilicon)/a ferroelectric layer (F) 5 of SBT ($SrBi_2Ta_2O_9$)/a second semiconductor layer (M) 6 of platinum. Further, the semiconductor substrate 1 is provided with a source region 7 and a drain region 8 on both sides of the channel region 2. Above the source region 7 and the drain region 8, there are laminated a third conductor 9 and a fourth conductor 10 of doped polysilicon respectively connected electrically to the source region 7 and the drain region 8 to thereby constitute a source portion and a drain portion. There are interposed second insulator thin films 11 respectively between the third conductor 9 and the first conductor layer 4 and between the fourth conductor 10 and the first conductor layer 4. Further, the third conductor 9 and the fourth conductor 10 are laminated to dispose on a side of the semiconductor substrate 1 relative to the first conductor layer 4. The gate portion of the MFMIS structure, the source portion and the drain portion including the third and the fourth conductors are formed in an element region of the semiconductor substrate 1.

According to the constitution, a total area of an area of the MIM structure formed by side walls of the third and the fourth conductors (M) 9 and 10 and side walls of the second insulator thin film (I) 11 and the first conductor layer (M) 4, and an area of the MIS structure formed by the semiconductor substrate 1 and the first insulator layer 3 and the first conductor layer 4, can be made larger than an area of the MFM structure formed by the first conductor layer 4 and the ferroelectric layer 5 and the second conductor layer 6. The total effective area including the MIS structure and the MIM structure can be changed by controlling heights of the first conductor layer 4 and the third and the fourth conductors 9 and 10.

That is, according to the constitution, an electrostatic capacitance of a total capacitor of a capacitor of the MIM structure formed by the side walls of the third and the fourth conductors (M) 9 and 10 and the second insulator thin film (I) 11 and the first conductor layer (M) 4 and a capacitor of the MIS structure formed by the semiconductor substrate (S) 1 and the first insulator layer (I) 3 and the first conductor layer (M) 4, constitutes a capacitance $C_I$ of a gate insulator capacitor. An electrostatic capacitance of a capacitor of the MFM structure formed by the first conductor layer 4 and the ferroelectric layer 5 and the second conductor layer 6, constitutes a capacitance $C_F$ of the ferroelectric capacitor. Therefore, the magnitude of the capacitance $C_I$ can be changed by controlling the heights of the first conductor layer 4 and the third and the fourth conductors 9 and 10.

According to the constitution, there is constructed a constitution in which the capacitor of the MIM structure constituted by the first conductor layer 4, the second insulator thin film 11 and the third conductor and the fourth conductor 9 and 10, is connected in parallel with the capacitor of the MIS structure constituted by the first conductor layer 4, the first insulator layer 3 and the semiconductor substrate 1 and therefore, the effective area of the MIS structure can be increased and the electrostatic capacitance $C_I$ of a composite capacitor thereof is increased.

Thereby, even when occupied areas of the capacitor areas of the MFM structure and the MIS structure on the main face of the semiconductor substrate 1 are the same, the effective area of the MIS structure can be made larger than the effective area of the MFM structure. Therefore, the coupling ratio $(C_I/(C_I+C_F))$ of the electrostatic capacitance $C_F$ of the capacitor of the MFM structure and the composite electrostatic capacitance $C_I$ of the capacitor of the MIS structure and the capacitor of the MIM structure can be increased without increasing a memory cell area than that of the conventional example. In this way, the area of the MIS capacitor laminated in the up and down direction substantially in the same area can be made larger than the area of the MFM portion capacitor without increasing the occupied area, as a result, integrated formation can be constituted at a higher density by reducing the memory cell area and a highly reliable transistor type ferroelectric nonvolatile storage element can be constituted.

Next, an explanation will be given of a method of fabricating the semiconductor nonvolatile storage element according to the first embodiment shown in FIG. 1 in reference to FIG. 2A through FIG. 2I. FIGS. 2A through 2I are sectional views showing steps of the fabricating method.

Figure 2A:
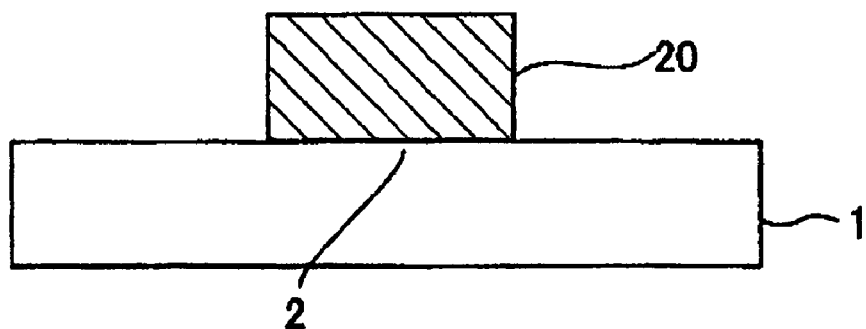
FIGS. 2A through 2J are sectional views showing respective steps of a method of fabricating the semiconductor nonvolatile storage element according to the first embodiment of the invention shown in FIG. 1.

First, a silicon semiconductor substrate 1 (using p-type substrate as an example) is prepared and an oxide film is deposited on the semiconductor substrate 1 by a normal pressure CVD process. Further, a dummy gate oxide film layer pattern 20 is formed on the channel region 2 above the semiconductor substrate 1 by normal lithography technology and etching technology (FIG. 2A).

Figure 2B:
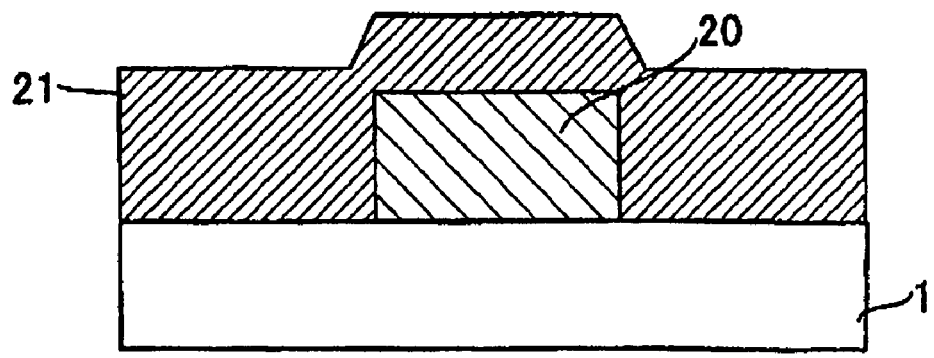

Next, a polysilicon (Poly-Si) layer 21 doped with phosphor (for constituting the third and the fourth conductors at a later step) is deposited above the semiconductor substrate 1 up to on the dummy gate oxide layer pattern 20 by a low pressure CVD process (FIG. 2B).

Figure 2C:
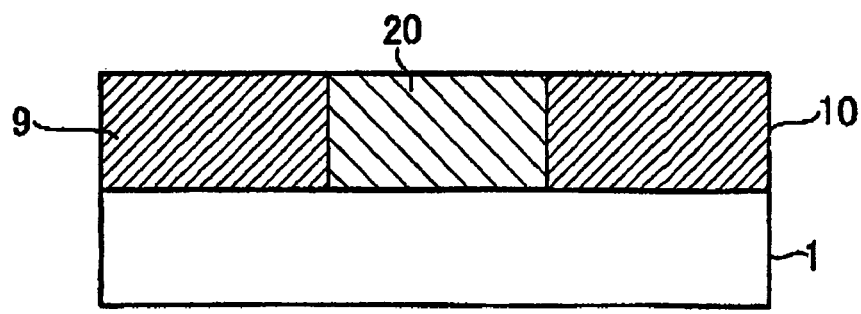

Next, the doped polysilicon layer 21 is flattened by a CMP (Chemical and Mechanical Polishing) flattening process to thereby form the third conductor 9 and the fourth conductor 10 on both sides of the dummy gate oxide film pattern 20 (FIG. 2C).

Figure 2D:
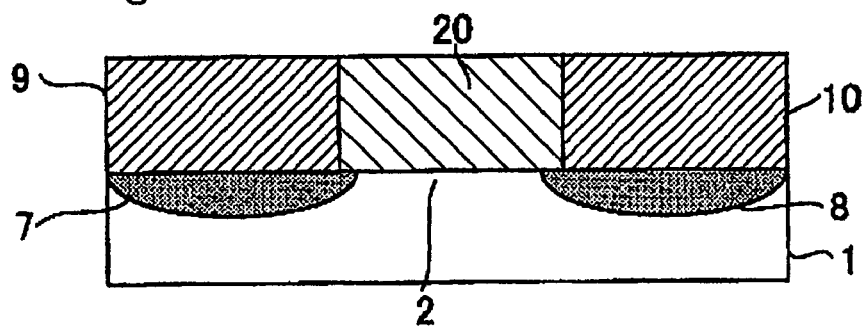

Next, by subjecting the semiconductor substrate 1 to an annealing, phosphor is diffused from the third conductor 9 and the fourth conductor 10 of polysilicon layers doped with phosphor at a high concentration into the silicon semiconductor substrate 1 in order to form the source region 7 and the drain region 8 by solid-solid phase diffusion (FIG. 2D). According to the method, impurity diffusion at high concentration can be carried out more uniformly and shallowly than other method. Further, according to the method, the polysilicon layers can be used as the third and the fourth conductors (electrodes) 9 and 10 as they are.

Figure 2E:
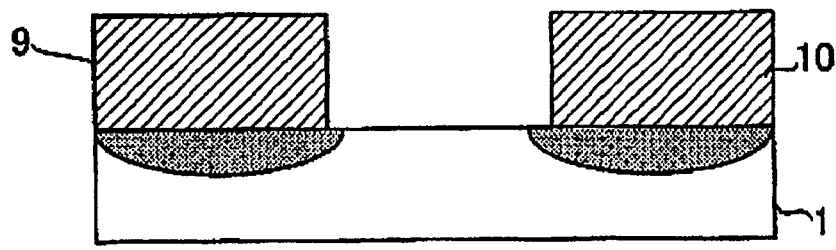

Next, the dummy gate oxide film layer 20 is removed by an HF treatment or the like (FIG. 2E).

Figure 2F:
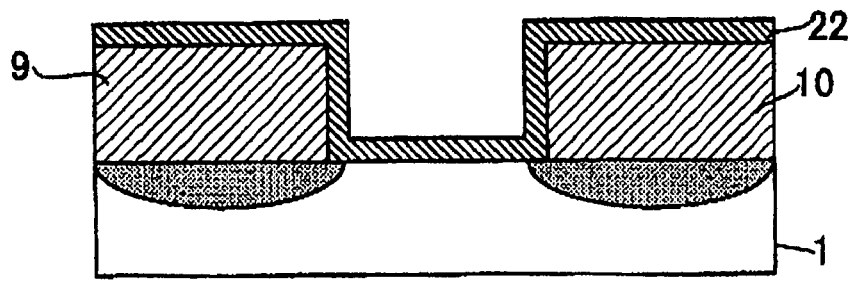

Next, an insulating layer 22 of silicon dioxide ($SiO_2$) is formed on the semiconductor substrate 1 and on the third and the fourth conductors 9 and 10 and side walls thereof by a thickness of 10 nm by thermal oxidation (FIG. 2F). The first insulator layer 3 (on the semiconductor substrate 1) and the second insulator thin films 11 (on the side walls of the third and the fourth conductors 9 and 10) are formed from the insulating layer 22.

Next, polysilicon (Poly-Si) 23 doped with phosphor is deposited on and embedded in a recessed portion at a location at which the dummy gate has been present by a low pressure CVD process and deposited also on the insulating layer 22 above the third and the fourth conductors 9 and 10. Further, the polysilicon 23 may be deposited into the recess portion at which the dummy gate has been present, at least until constituting a height the same as a height of the third and the fourth conductors 9 and 10 and it is not necessary to deposit the polysilicon 23 on the insulating layer 22. The polysilicon 23 constitutes the first conductor layer 4. Next, a barrier layer 24 of iridium oxide ($IrO_2$) for preventing diffusion of the ferroelectric body is deposited by a thickness of 200 nm by a sputtering process. Next, a ferroelectric layer 25 of SBT ($SrBi_2Ta_2O_9$) is formed by a thickness of 300 nm by preparing an organic metal solution the composition of which has previously been determined and coating and sintering the ferroelectric layer 25 by a spin coating process. Next, a platinum (Pt) layer 26 constituting the second conductor layer is deposited by a thickness of 200 nm by a sputtering process (FIG. 2G).

Figure 2G:
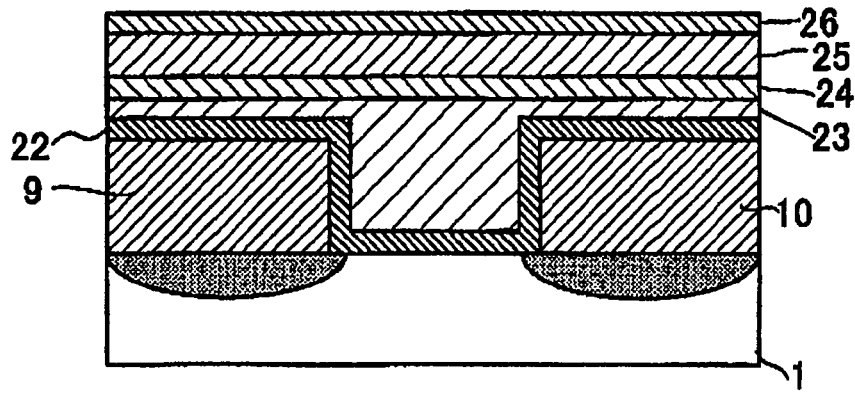
Figure 2H:
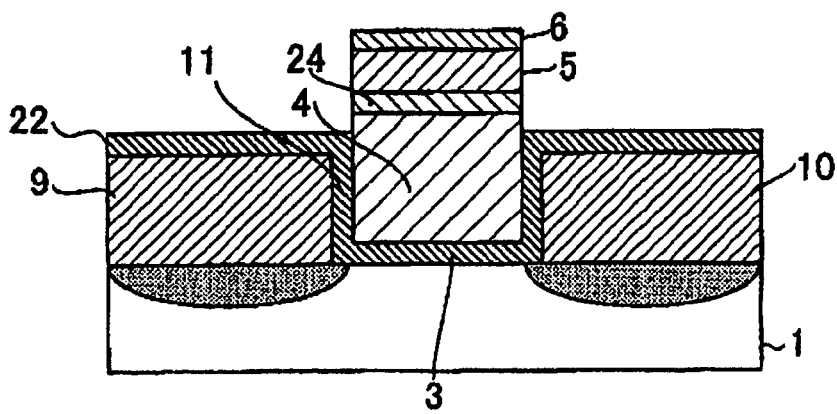

Next, the MFMIS structure of the gate portion is formed by successively etching the platinum (Pt) layer 26 for constituting the second conductor layer 6, the SBT layer 25 for constituting the ferroelectric layer 5, the barrier ($IrO_2$) layer 24 and the polysilicon (Poly-Si) layer 23 for constituting the first conductor layer 4 (when deposited on the insulating layer 22) by normal lithography technology and dry etching technology (FIG. 2H).

Figure 2I:
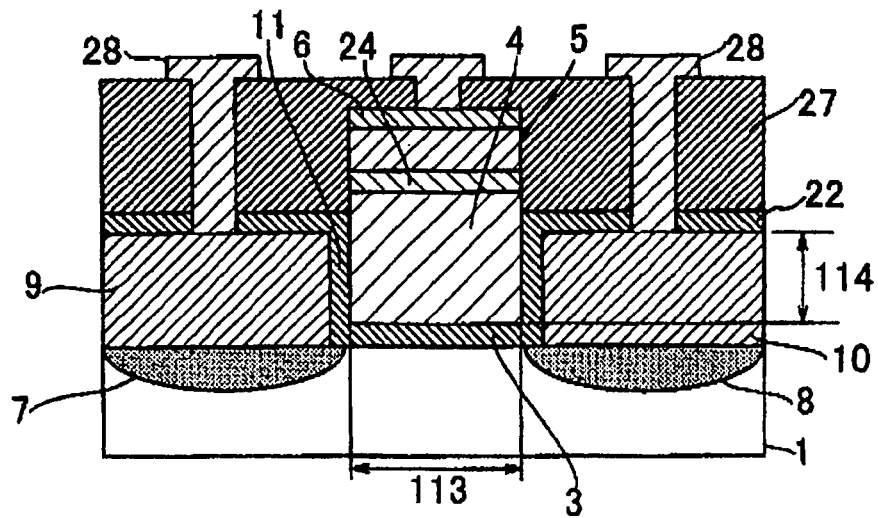

Next, after forming to deposit silicon dioxide ($SiO_2$) to constitute an interlayer insulating film 27 by a plasma CVD, there are perforated contact holes reaching the third and the fourth conductors 9 and 10 above the second conductor (Pt) layer 6 and above the source region 7 and the drain region 8 and an aluminum electrode (Al) 28 is formed and fabricated to thereby finish the semiconductor nonvolatile storage element (FIG. 2I).

Figure 2J:
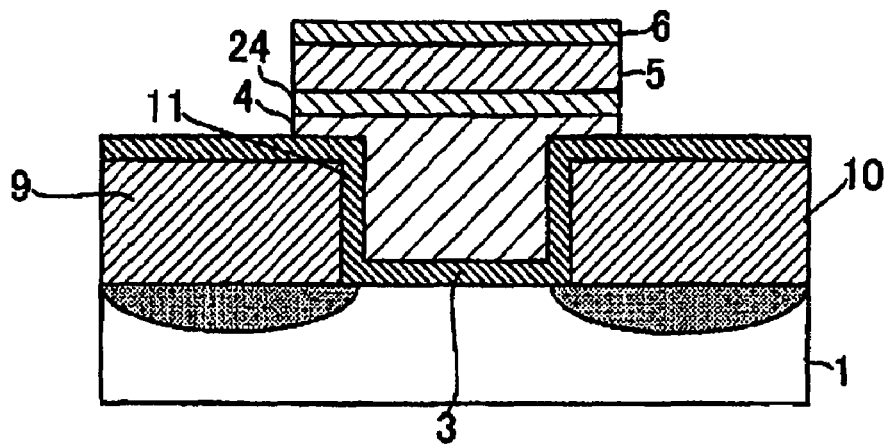

Further, a size of forming the pattern of the MFM structure after forming the second conductor layer (Pt) 26 at step of FIG. 2G, may not necessarily be the same as a channel length of the transistor but the size may be fabricated to be a little larger as shown by FIG. 2J.

According to the fabricating method, when the layer 25 of the ferroelectric capacitor is formed, the silicon substrate 1 is not exposed and therefore, there is achieved an advantage that the device characteristic is prevented from being deteriorated by isolating an impurity included in the ferroelectric body and diffusing the impurity to silicon.

According to the fabricating method, even when the area of the MIS structure comprising the semiconductor substrate 1 and the first insulating film 3 and the first conductor layer 4 occupied at the main face of the semiconductor, is substantially the same as that of the MFM structure comprising the first conductor layer 4 and the ferroelectric layer 5 and the second conductor layer 6 thereabove, by adopting the structure, the effective area of the total capacitor $C_I$ of the buffer layer can be made larger than the area of the MFM capacitor. Therefore, according to the constitution, a coupling ratio ($C_I/(C_I+C_F)$) of the electrostatic capacitance $C_F$ of the MFM capacitor to the composite electrostatic capacitance $C_I$ of the MIS capacitor and the MIM capacitor, can be increased without increasing the memory cell area as compared with the related art example and distributed voltage can efficiently be applied to the ferroelectric capacitor.

When a capacitance constituted by the semiconductor substrate and the first insulating film and the first conductor is designated by notation $C_{MIS}$, a capacitance constituted by the first conductor layer and the second insulator thin film and the third and the fourth conductors, is designated by notation $C_{MIM}$, a gate length (a distance 113 interposed by the second insulator thin films of FIG. 2I) is designated by notation L, a gate width (depth of the second insulator thin film of the FIG. 2I although not illustrated) is designated by notation W, a distance 114 between a bottom face of the first conductor layer and upper faces of the third and the fourth conductors of FIG. 2I, is designated by notation h, a film thickness of the second insulator thin film (the film thickness is an average distance of a region sandwiched by the first conductor layer and the third or the fourth conductor) is designated by notation t and a film thickness of the oxide film of the first insulator layer (average distance of a region sandwiched by the semiconductor substrate and the first conductor layer) is designated by notation d, a change of a composite electrostatic capacitance comprising $C_{MIS}$ and $C_{MIM}$ relative to $C_{MIS}$ becomes as follows.

$$(C_{MIM}+C_{MIS})/C_{MIS}=(2 \times h \times d/L \times t)+1$$

Figure 13:
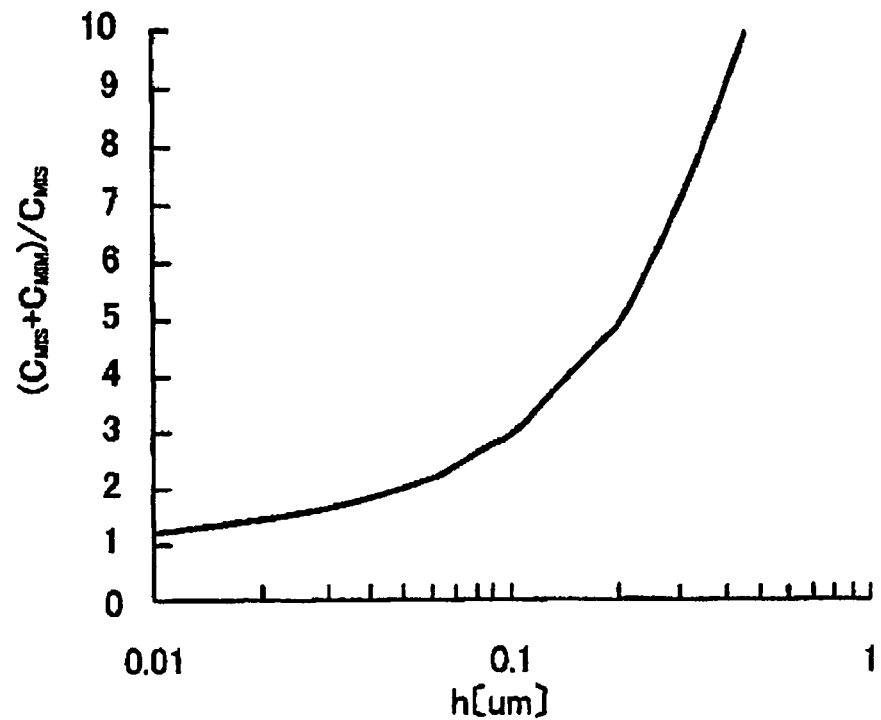
FIG. 13 is a characteristic diagram showing a relationship between ($C_{MIN}+C_{MIS}$)/$C_{MIS}$ of the semiconductor involatile storage element according to the first embodiment of the invention shown in FIG. 2I and a distance 114(h) between a bottom face of a first conductor layer and upper faces of a third and a fourth conductor.

Here, as an example, FIG. 13 shows a relationship between the distance 114 (h) between the bottom face of the first conductor layer and the upper faces of the third and the fourth conductors and ($C_{MIM}+C_{MIS}$)/$C_{MIS}$ when assuming that the gate length (L) is 0.1 μm, the gate width (W) is 0.1 μm, the film thickness (t) of the second insulator thin film is 3 nm and the film thickness (d) of the oxide film of the first insulator layer is 3 nm.

In reference to FIG. 13, when the distance 114 ($h$) between the bottom face of the first conductor layer and the upper faces of the third and the fourth conductors becomes long, the change in the composite electrostatic capacitance comprising $C_{MIS}$ and $C_{MIM}$ relative to $C_{MIS}$ is increased.

Therefore, the total area of the capacitor comprising the MIS structure and the MIM structure, can be changed by controlling the heights of the first conductor layer and the third and the fourth conductors.

Figure 14:
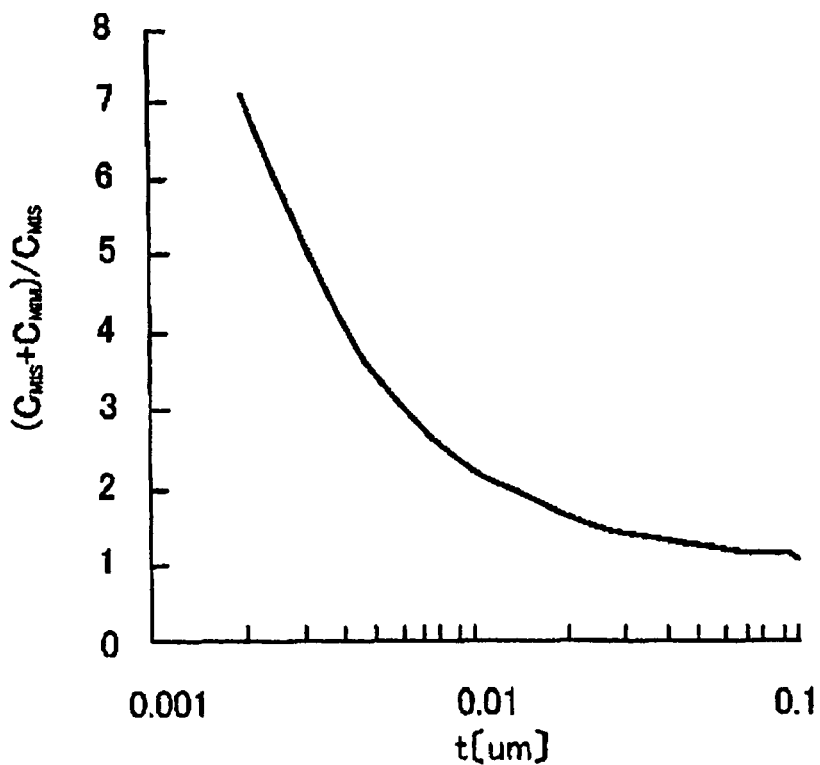
FIG. 14 is a characteristic diagram showing a relationship between ($C_{MIN}+C_{MIS}$)/$C_{MIS}$ of the semiconductor nonvolatile storage element according to the first embodiment of the invention shown in FIG. 2I and a film thickness (t) of a second insulator thin film.

Further, FIG. 14 shows a relationship between the film thickness t of the second insulator thin film and ($C_{MIM}+C_{MIS}$)/$C_{MIS}$ when assuming that the gate length (L) is 0.1 μm, the gate width (W) is 0.1 μm, the distance 114 between the bottom face of the first conductor layer and the upper faces of the third and the fourth conductors of FIG. 2I is 0.2 μm and the film thickness (d) of the oxide film of the first insulator layer is 3 nm. The relationship shows that a thickness t of 0.01μ, which is one tenth the gate length (L) of 0.1 μm, the composite capacitance ratio ($C_{MIN}+C_{MIS}$)/$C_{MIS}$ is greater than 2 and increases for lower values.

In reference to FIG. 14, when the film thickness (t) of the second insulator thin film becomes thinner than the gate length, the change in the composite electrostatic capacitance comprising $C_{MIS}$ and $C_{MIM}$ relative to $C_{MIS}$ is increased. Further, the occupied area constituted by MIM is reduced and an increase in the cell area is restrained.

Therefore, the film thickness of the second insulator thin film is preferably thin so far as withstand voltage and leakage current are permitted.

Second Embodiment

Figure 3:
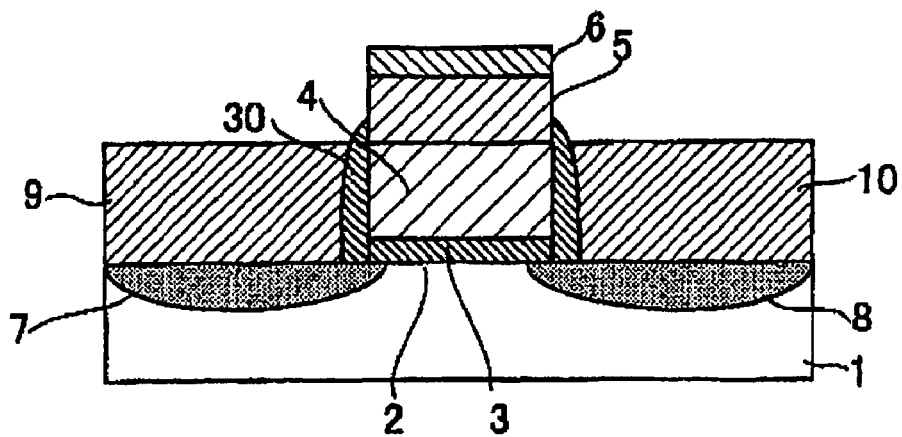
FIG. 3 is a sectional view showing a constitution of a semiconductor nonvolatile storage element according to a second embodiment of the invention.

Next, an explanation will be given of a semiconductor nonvolatile storage element according to a second embodiment in reference to FIG. 3. The second embodiment can be formed basically by process steps near to those of a case of forming an MOS structure. A main point different from the first embodiment shown in FIG. 1 resides in that a second insulator thin film 30 is formed separately from the first insulator film (I) 3. Therefore, the second insulator thin film 30 is provided with a function of a side spacer in implanting ions such that an LDD (lightly doped drain) structure can be formed. Other constitution of the second embodiment shown in FIG. 3 is similar to the first embodiment shown in FIG. 1 and accordingly, portions in correspondence with those of FIG. 1 are attached with the same notations and an explanation thereof will be omitted.

Next, an explanation will be given of a method of fabricating the semiconductor nonvolatile storage element according to the second embodiment shown in FIG. 3 in reference to FIG. 4A through FIG. 4H. FIGS. 4A through 4H are sectional views showing steps of the fabricating method.

Figure 4A:
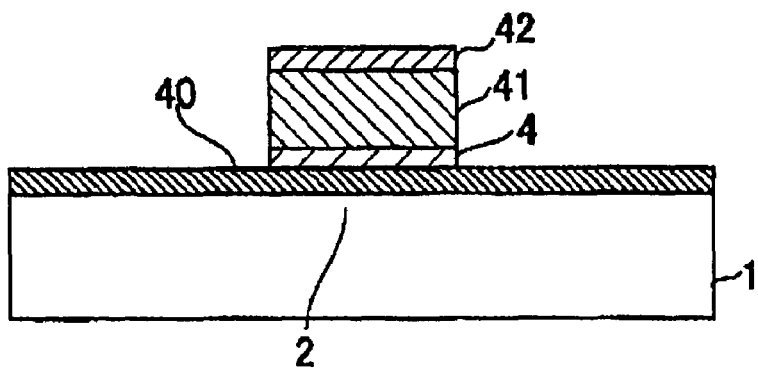
FIGS. 4A through 4H are sectional views showing respective steps of a method of fabricating the semiconductor nonvolatile storage element according to the second embodiment of the invention shown in FIG. 3.

First, the silicon semiconductor substrate 1 (p-type substrate in the case of an n-channel transistor) is prepared and a gate insulating film 40 (for constituting the first insulator layer 3) is made to grow by a thickness of 10 nm on the substrate 1 by a thermal oxidation process. Further, polysilicon (Poly-Si) doped with phosphor is deposited by a low pressure CVD process (constituting the first conductor layer 4), successively, a barrier layer 41 of $IrO_2$ for preventing diffusion of the ferroelectric body is deposited by a sputtering process. Next, a silicon nitride layer 42 (SiN) (constituting a hard mask layer) is deposited. Further, $SiN/IrO_2$/Poly-Si constituting a basis of the gate portion is fabricated on the channel region 2 of the semiconductor substrate by normal lithography technology and dry etching technology (FIG. 4A).

Figure 4B:
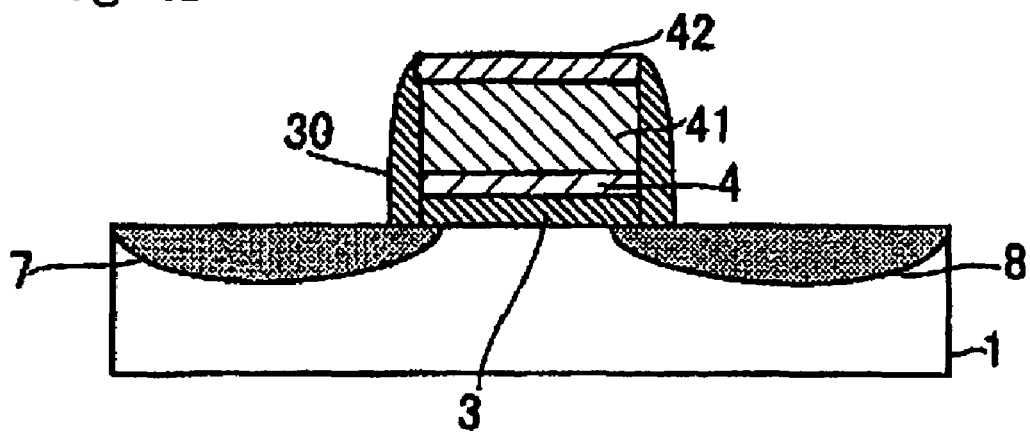

Next, phosphor is ion-implanted to the semiconductor substrate 1 in order to form the source region 7 and the drain region 8 and the impurity is activated by an annealing. Next, when an oxide film is conformally deposited by an atmospheric CVD process and the deposited oxide film is etched by dry etching, an oxide film for constituting the second insulator thin film 30 remains only at a side wall of the gate portion (FIG. 4B).

Figure 4C:
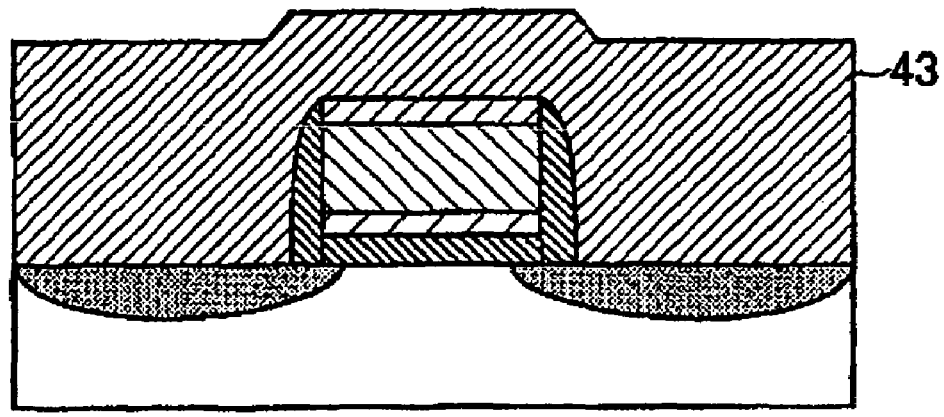

Next, a polysilicon (Poly-Si) layer 43 doped with phosphor (constituting the third and the fourth conductors 9 and 10 at a later step) is deposited up to above the silicon nitride layer 42 by a low pressure CVD process (FIG. 4C).

Figure 4D:
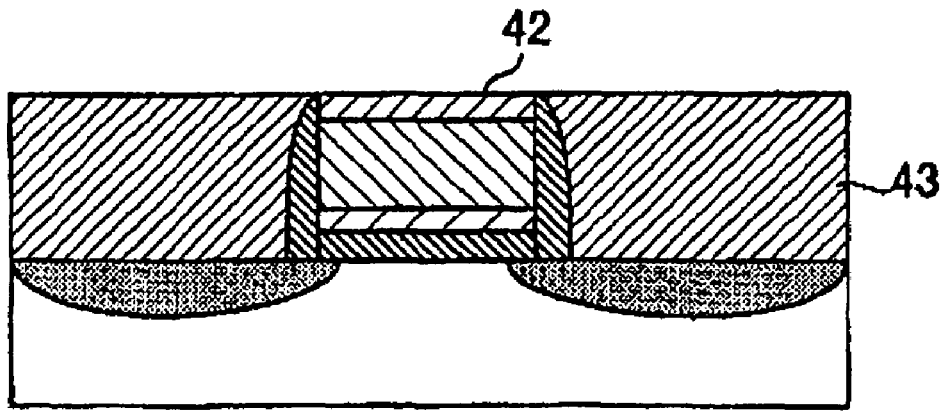

Next, the doped polysilicon layer 43 is flattened by a chemical and mechanical polishing (CMP) flattening process to thereby expose the silicon nitride layer 42 (FIG. 4D).

Figure 4E:
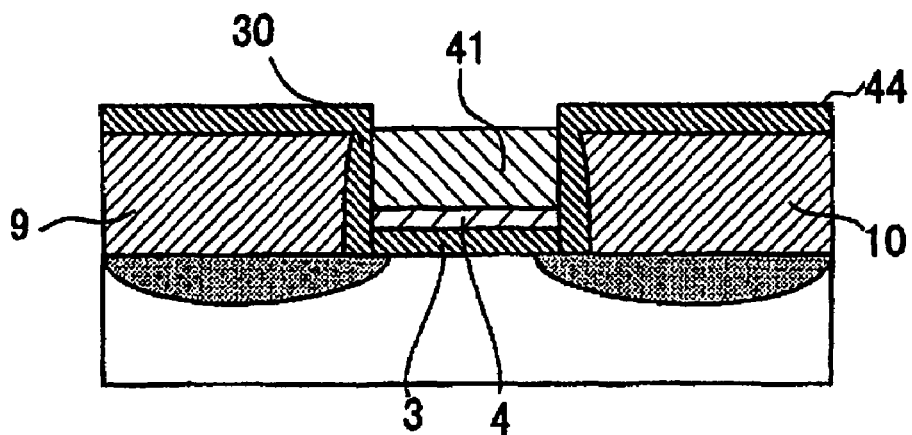

Next, by oxidizing an upper portion of the polysilicon layer 43 by thermal oxidation, there is formed an oxide layer 44 of silicon dioxide connected to the second insulator thin film 30 on the side wall of the polysilicon layer 43. At this occasion, the upper portion of the silicon nitride (SiN) layer 42 is not oxidized. Next, the silicon nitride (SiN) layer 42 is removed by phosphoric acid boiling (FIG. 4E). Upper portions of the third and the fourth conductors 9 and 10 formed from the polysilicon layer 43, which is not oxidized, are made to dispose on faces substantially the same as the upper portion of the barrier layer 41 after removing the silicon nitride layer 42 or nearer to the semiconductor substrate 1.

Figure 4F:
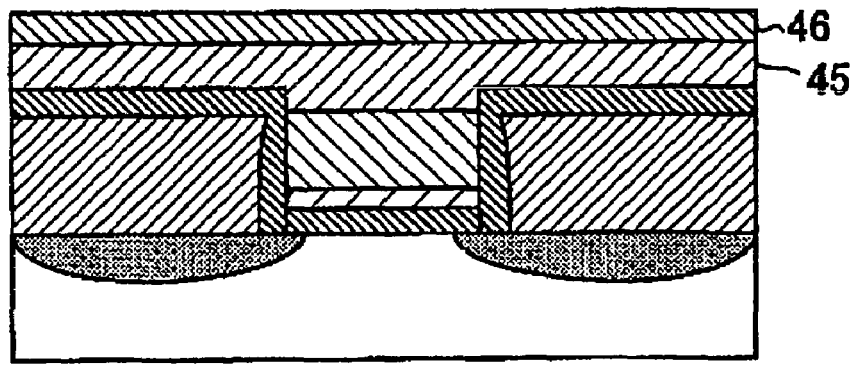

Next, an SBT ferroelectric layer 45 is formed by a thickness of 300 nm by a spin coating process. At this occasion, the ferroelectric layer 45 is embedded also to a portion removed of the silicon nitride layer 42 and the embedded ferroelectric layer 45 is deposited on the barrier layer 41 and is made to be disposed substantially on an upper side of the semiconductor substrate relative to the third and the fourth conductors 9 and 10. Next, a platinum (Pt) layer 46 for constituting the second conductor layer is deposited by a thickness of 200 nm by a sputtering process (FIG. 4F).

Figure 4G:
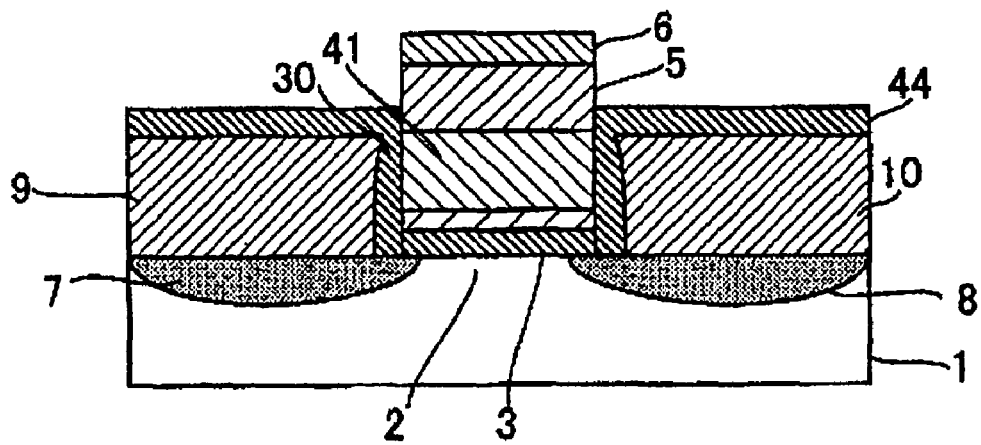

Next, by successively etching the platinum (Pt) layer 46 and the SBT ferroelectric layer 45 by normal lithography technology and dry etching, there are formed the ferroelectric layer 5 and the second conductor layer 6 constituting an upper side of the gate portion (FIG. 4G).

Figure 4H:
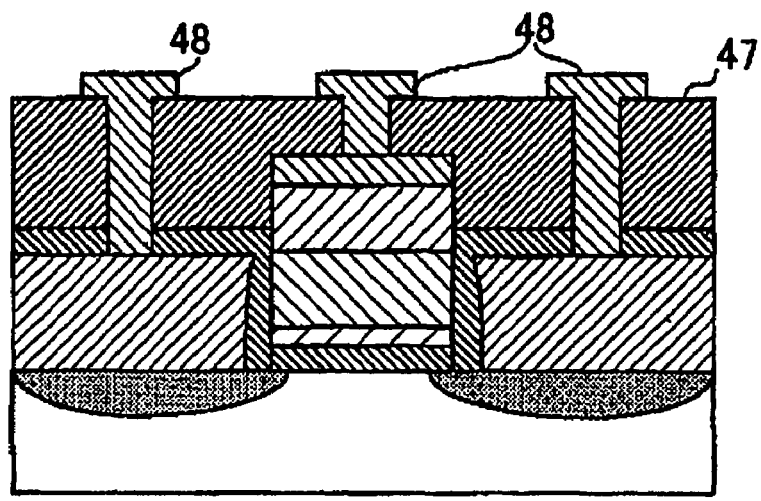

Next, after forming silicon dioxide by plasma CVD to constitute an interlayer insulating film 47, there are perforated contact holes reaching the second conductor (Pt) layer, and the third conductor 9 and the fourth conductor 10 above the source region 7 and above the drain region 8 and an aluminum electrode 48 is formed and fabricated to thereby finish the semiconductor nonvolatile storage element (FIG. 4H).

According to the fabricating method, in step (FIG. 4B), when ions are implanted to the source region 7 and the drain region 8 by constituting a mask by a base portion of a gate and constituting a side spacer by the second insulator thin films 30, the LDD (lightly doped drain) structure can be formed.

Third Embodiment

Figure 5:
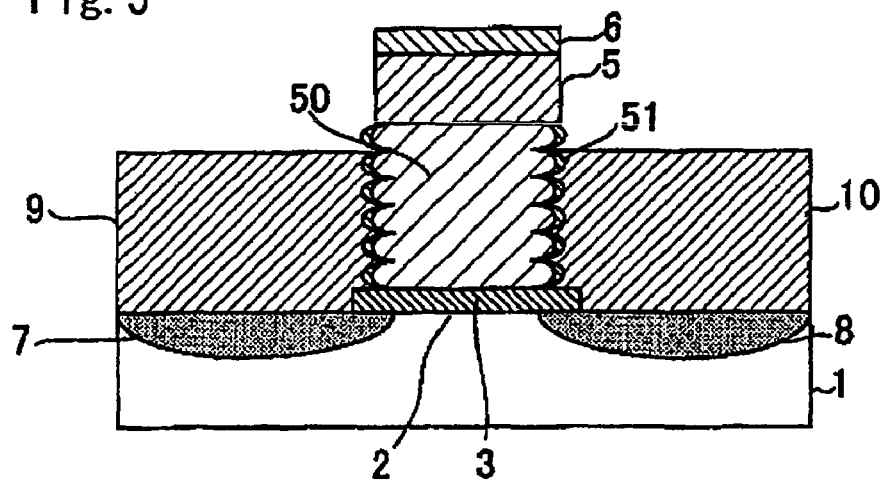
FIG. 5 is a sectional view showing a constitution of a semiconductor nonvolatile storage element according to a third embodiment of the invention.

Next, an explanation will be given of a constitution of a semiconductor nonvolatile storage element according to a third embodiment in reference to FIG. 5. According to the constitution of the embodiment, a surface of a side wall of a first conductor layer 50 is formed with very small recesses and projections to thereby increase a surface area thereof. Specifically, there is carried out a roughening (Hemispherical Silicon Grain: HSG, or hemispherical surface) treatment on a surface of a polysilicon (Poly-Si) gate side wall for constituting the first conductor layer 50 and the surface area is increased to about twice as much as the original surface area. There is provided a second insulator thin film 51 of silicon oxide at a side wall of polysilicon of the first conductor layer 50. FIG. 5 shows a section of an essential portion of the embodiment and other portions are the same as those in the first embodiment and accordingly, portions similar to those of the first embodiment shown in FIG. 1 are attached with corresponding notations and an explanation thereof will be omitted.

Next, an explanation will be given of a method of fabricating the semiconductor nonvolatile storage element according to the third embodiment shown in FIG. 5 in reference to FIG. 6A through FIG. 6J. Views shown by FIG. 6A through FIG. 6J are sectional views of steps thereof.

Figure 6A:
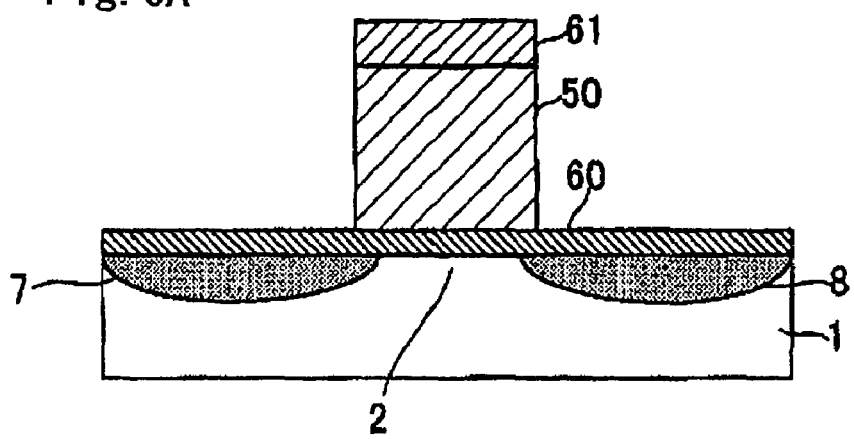
FIGS. 6A through 6J are sectional views showing respective steps of a method of fabricating the semiconductor nonvolatile storage element according to the third embodiment of the invention shown in FIG. 5.

First, the silicon semiconductor substrate 1 (p-type substrate in the case of an n-channel transistor) is prepared and a thermally oxidized film ($SiO_2$) is made to grow by a thickness of 10 nm as a gate insulating film 60 for constituting the first insulator layer 3 on the semiconductor substrate 1. Next, amorphous silicon ($\alpha$-Si) for constituting the first conductor layer 50 is deposited by a low pressure CVD process and thereafter, a silicon nitride (SiN) layer 61 for constituting a hard mask layer is deposited by a thickness of 200 nm by a low pressure CVD process. Next, the silicon nitride layer 61 and the amorphous silicon layer 50 are etched in order to form a laminated body (SiN/$\alpha$-Si) for constituting the base portion of the gate portion above the channel region 2 of the semiconductor substrate 1 by normal lithography technology and dry etching technology. Next, phosphor is ion-implanted and the impurity is activated by an annealing in order to form the source region 7 and the drain region 8 (FIG. 6A).

Figure 6B:
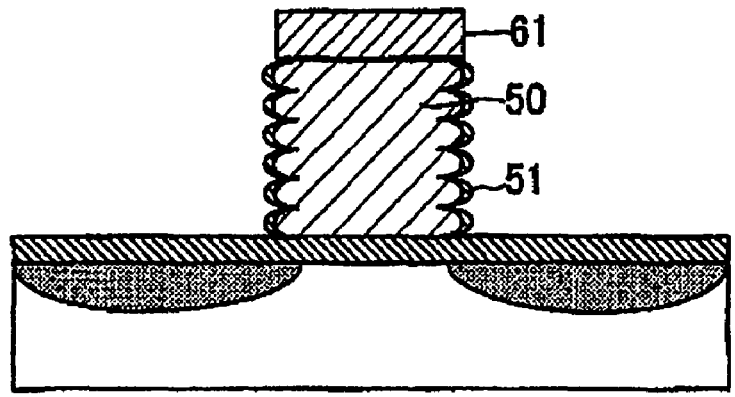

Next, in order to carry out a roughening treatment on the surface of the side wall of the amorphous silicon gate for constituting the first conductor layer 50, an annealing is carried out at 640° C. in vacuum to thereby form recesses and projections on the surface of the gate side wall. The surface area can be increased by about twice as much as the original surface area by the method. Next, a thermally oxidized film is formed as a second insulator thin film 51 on the gate side wall (FIG. 6B).

Figure 6C:
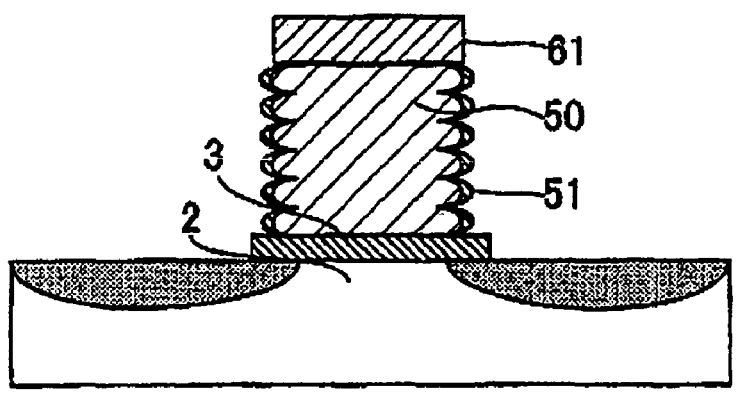

Next, the gate oxide film 60 on the source region 7 and the drain region 8 is removed by normal lithography technology and dry etching technology to thereby form the first insulator layer 3 on the channel 2 (FIG. 6C).

Figure 6D:
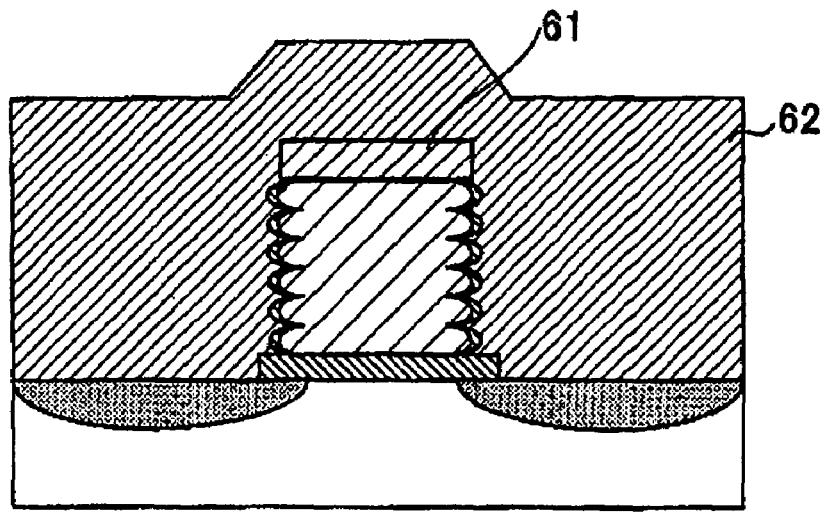

Next, a polysilicon (Poly-Si) layer 62 doped with phosphor (for constituting the third and the fourth conductors 9 and 10 at a later step) is deposited up to above the silicon nitride layer 61 by a low pressure CVD process (FIG. 6D).

Figure 6E:
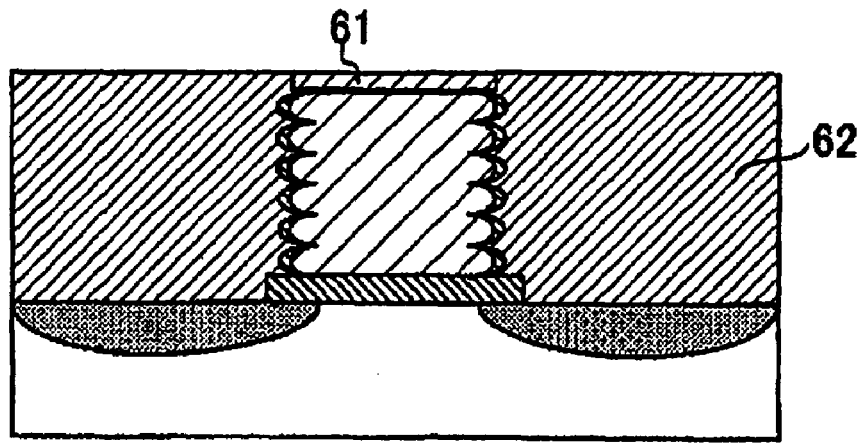

Next, the polysilicon layer 62 is flattened up to the silicon nitride layer 61 by a chemical and mechanical polishing (CMP) flattening process (FIG. 6E).

Figure 6F:
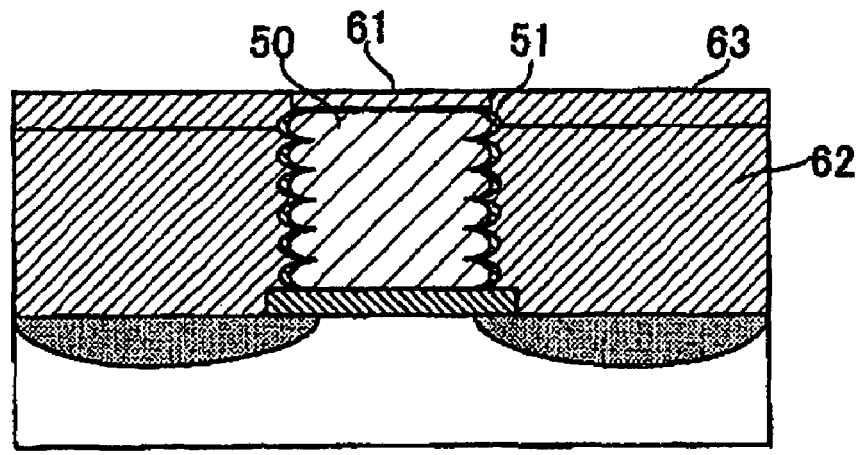

Next, an oxide layer 63 is formed at an upper portion of the polysilicon layer 62 by carrying out thermal oxidation. The oxide layer 63 is integrally connected to the second insulator thin film 51 at the side wall of the first conductor layer 50. At this occasion, the silicon nitride (SiN) layer 61 is not oxidized (FIG. 6F).

Figure 6G:
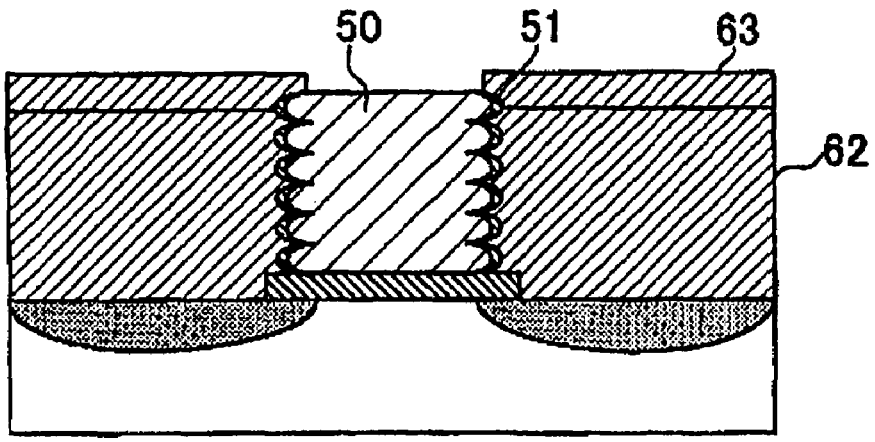

Next, the silicon nitride layer (SiN) layer 61 is removed by phosphoric acid boiling (FIG. 6G).

Figure 6H:
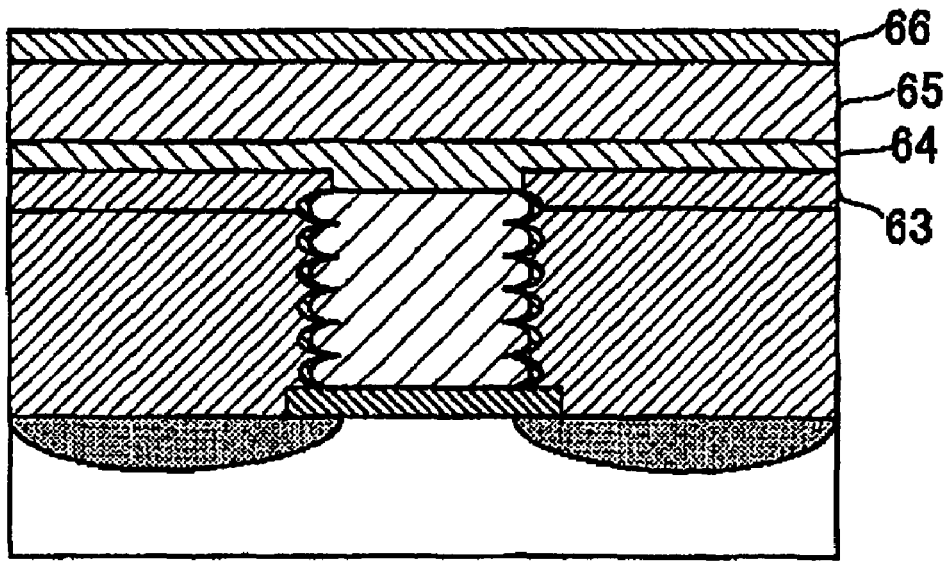

Next, a barrier ($IrO_2$) layer 64 for preventing diffusion of the ferroelectric body is deposited by a thickness of 200 nm by a sputtering process on the oxide layer 63 by embedding the recessed portion removed of the silicon nitride layer 61. Next, an SBT ferroelectric layer 65 is formed by a thickness of 300 nm by a spin coating process. Next, a platinum (Pt) layer 66 for constituting the second conductor layer is deposited by a thickness of 200 nm by a sputtering process (FIG. 6H).

Figure 6I:
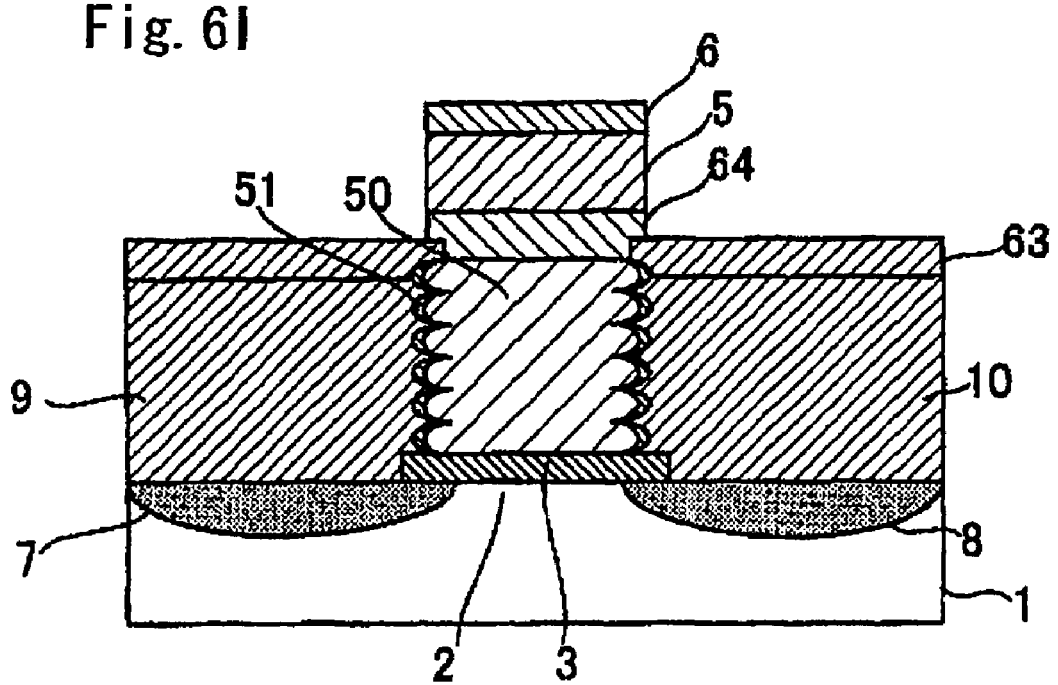

Next, the platinum (Pt) layer 66 and the SBT ferroelectric layer 65 and the barrier ($IrO_2$) layer 64 are successively etched by normal lithography technology and dry etching technology to thereby form the second conductor layer 6 and the ferroelectric layer 5 and the barrier layer 64 for constituting the gate portion (FIG. 6I).

Figure 6J:
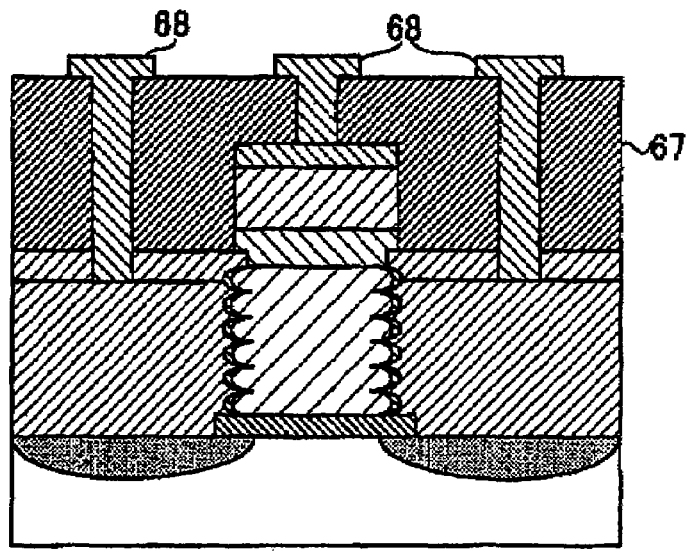

Next, after forming silicon oxide by a plasma CVD process to constitute an interlayer insulating film 67, there are perforated contact holes reaching the second conductor layer 6 and the third conductor 9 and the fourth conductor 10 above the source region 7 and above the drain region 8 and an aluminum electrode 68 is formed and fabricated to thereby finish the semiconductor nonvolatile storage element (FIG. 6J).

Fourth Embodiment

Figure 7:
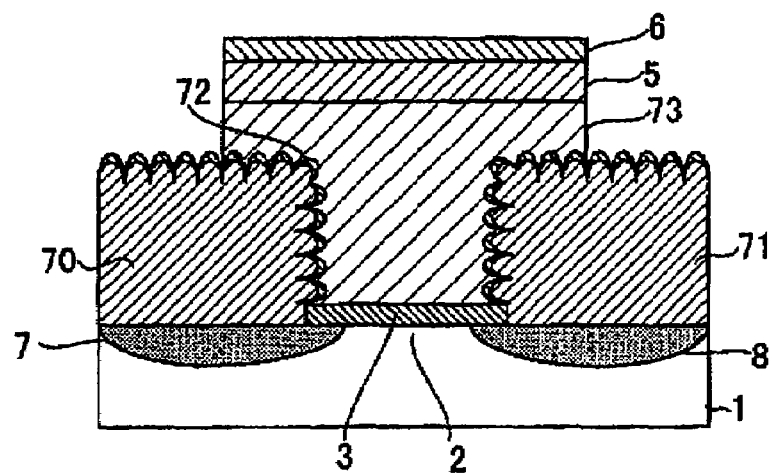
FIG. 7 is a sectional view showing a constitution of a semiconductor nonvolatile storage element according to a fourth embodiment of the invention.

Next, an explanation will be given of a structure of a semiconductor nonvolatile storage element according to a fourth embodiment in reference to FIG. 7. The embodiment is constructed by a constitution of increasing a surface area by forming very small recesses and projections on a surface including side walls of a third and a fourth conductor 70 and 71 opposed to each other. By constructing such a constitution, similar to the third embodiment, a capacitance of a capacitor of the MIM structure can be increased. A second insulator thin film 72 is provided at the side walls of the third and the fourth embodiments 70 and 71 opposed to each other. Further, insulating layers are also formed similarly at upper portions of the third and the fourth conductors 70 and 71. A first conductor layer 73 is embedded in and deposited on a recessed portion between the opposed side walls of the third and the fourth conductors 70 and 71 and an upper portion at a surrounding thereof. Other portions similar to those of the first embodiment explained in reference to FIG. 1 are attached with corresponding notations and an explanation thereof will be omitted.

Next, an explanation will be given of a method of fabricating the semiconductor nonvolatile storage element according to the fourth embodiment in reference to FIG. 8A through FIG. 8H. Views shown by FIGS. 8A through 8H are sectional views of steps thereof.

Figure 8A:
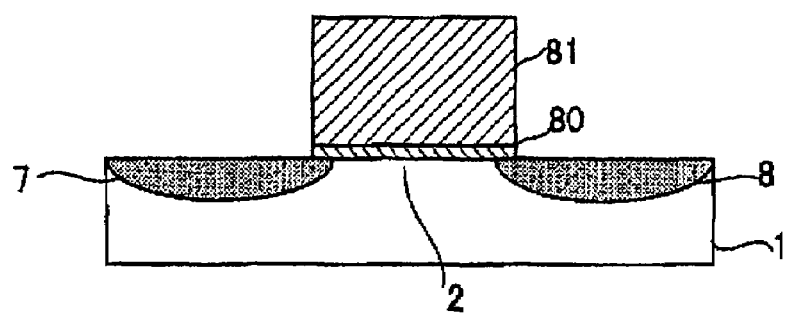
FIGS. 8A through 8H are sectional views showing respective steps of a method of fabricating the semiconductor nonvolatile storage element according to the fourth embodiment of the invention shown in FIG. 7.

First, a silicon semiconductor substrate 1 (p-type substrate in the case of an n-channel transistor) is prepared. A thermally oxidized film 80 is made to grow on the semiconductor substrate 1 by a thickness of 10 nm. A silicon nitride (SiN) film 81 is deposited by a low pressure CVD process. Next, a portion of the silicon nitride (SiN) film 81 other than the channel region 2 is removed by normal lithography technology and dry etching technology. Next, phosphor is ion-implanted and the impurity is activated by an annealing in order to form the source region 7 and the drain region 8. Next, the oxide film 80 on the source region 7 and the drain region 8 other than the channel region 2 is removed by hydrogen fluoride (HF) solution (FIG. 8A).

Figure 8B:
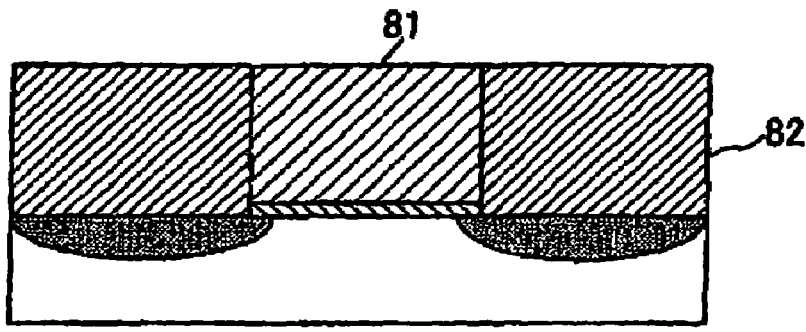

Next, a doped amorphous silicon ($\alpha$-Si) layer 82 is deposited to be thicker than the silicon nitride film 81 by a low pressure CVD process and thereafter, the amorphous silicon layer 82 is flattened up to the silicon nitride film 81 by a chemical and mechanical polishing (CMP) flattening process (FIG. 8B).

Figure 8C:
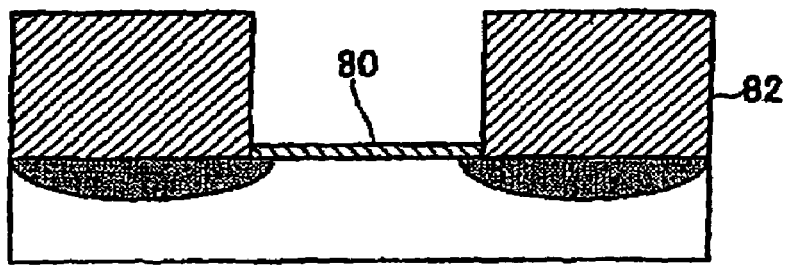

Next, the silicon nitride (SiN) film 81 is removed by phosphoric acid boiling to thereby form a recessed portion having side walls of the amorphous silicon layer 82 opposed to each other (FIG. 8C).

Figure 8D:
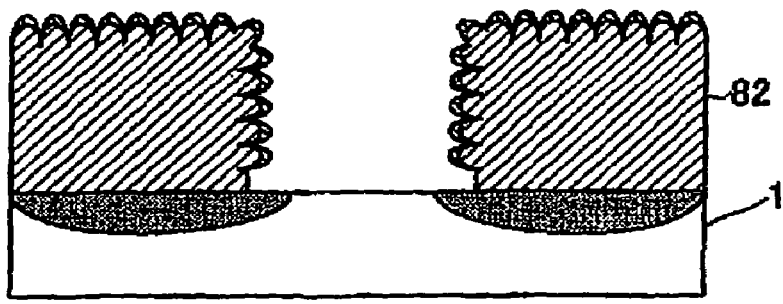

Next, in order to carry out roughening treatment on the surfaces of the side walls of the amorphous silicon layer 82 opposed to each other, an annealing is carried out at 640° C. in vacuum to thereby form recesses and projections on the surfaces of the side walls. The surface area can be increased by about twice as much as the original surface area by the method. Next, the oxide film 80 on the semiconductor substrate 1 is removed by hydrogen fluoride (HF) species to thereby expose the channel portion of the semiconductor substrate 1 (FIG. 8D).

Figure 8E:
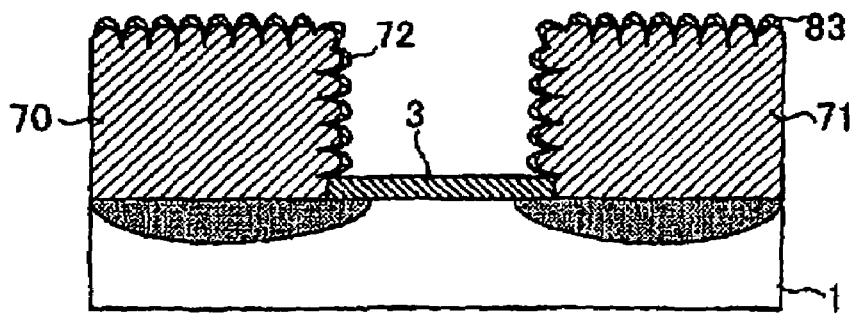

Next, there are formed a first insulator layer 3 on the semiconductor substrate 1, a second insulator thin film 72 on recesses and projections of side walls of a third and a fourth conductor 70 and 71 opposed to each other formed by amorphous silicon and an oxide film 83 on recesses and projections of upper faces of the third and the fourth conductors 70 and 71, by a film thickness of 10 nm by a thermal oxidation process (FIG. 8E).

Figure 8F:
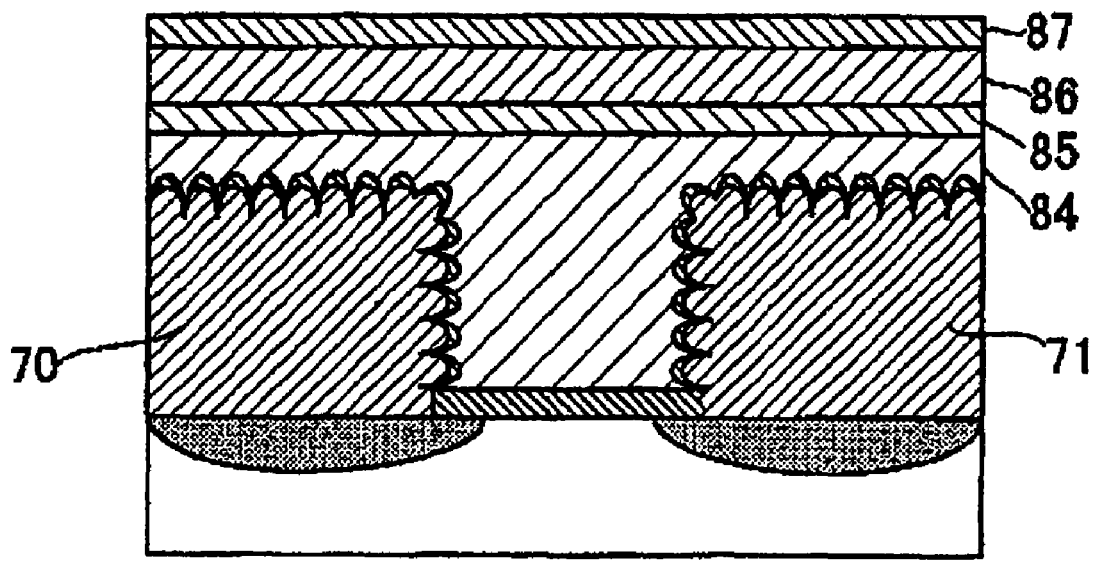

Next, a polysilicon (Poly-Si) layer 84 doped with phosphor for constituting a first conductor layer 73, is embedded to a recessed portion between side faces of the third and the fourth conductors 70 and 71 opposed to each other and deposited on the third and the fourth conductors 70 and 71 by a low pressure CVD method. Next, a barrier ($IrO_2$) layer 85 for preventing diffusion of the ferroelectric body is deposited by a thickness of 200 nm by a sputtering process. Next, an SBT ferroelectric layer 86 is deposited by a thickness of 300 nm by a spin coating process. Next, a platinum (Pt) layer 87 for constituting a second conductor layer is deposited by a thickness of 200 nm by a sputtering process (FIG. 8F).

Figure 8G:
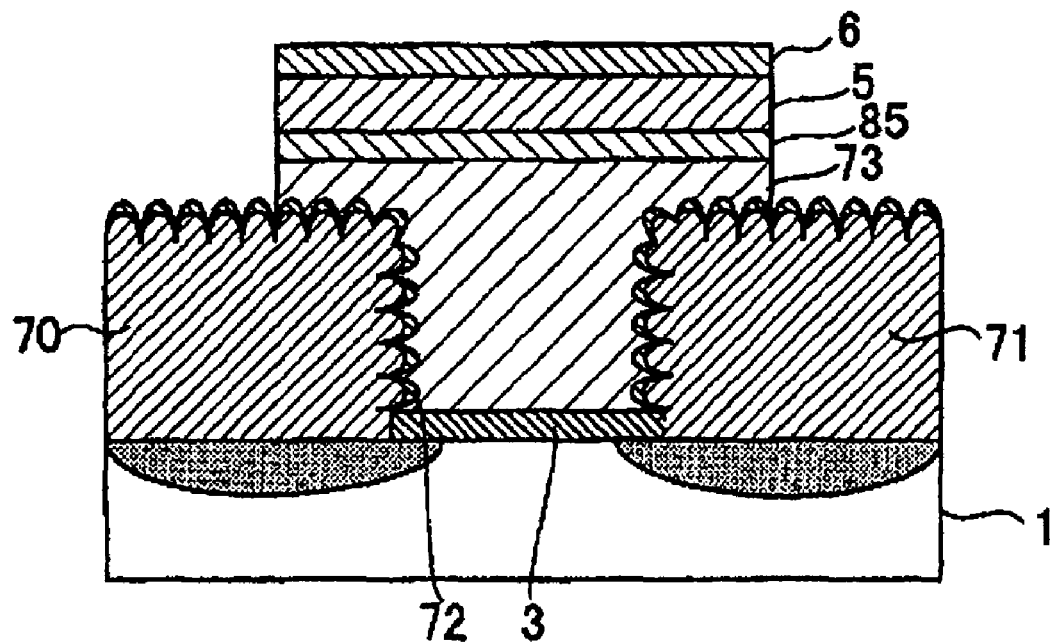

Next, the second conductor layer 6, the ferroelectric layer 5, the barrier layer 85 and the first conductor layer 73 are formed by successively etching the platinum (Pt) layer 87, the SBT ferroelectric layer 86, the barrier (IrO$_2$) layer 85 and the polysilicon layer 84 by normal lithography technology and dry etching technology (FIG. 8G).

Figure 8H:
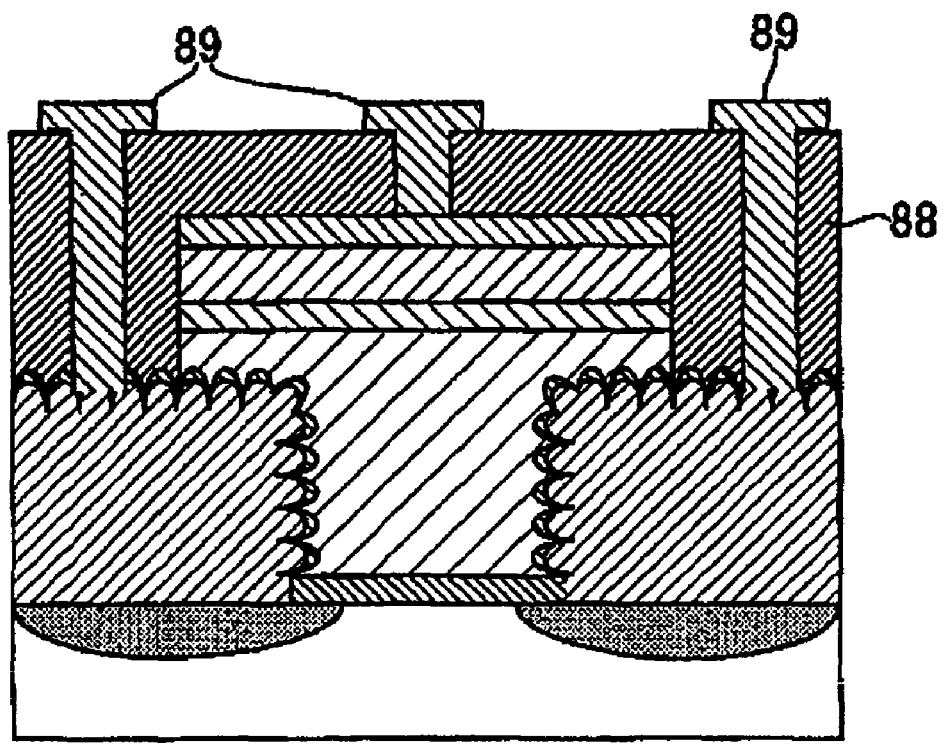

Next, after depositing silicon oxide by a plasma CVD process to constitute an interlayer insulating film 88, there are perforated contact holes reaching the second conductor layer 6 and the third conductor 70 and the fourth conductor 71 above the source region 7 and the drain region 8 and an aluminum electrode 89 is formed and fabricated to thereby finish the semiconductor nonvolatile storage element (FIG. 8H).

Further, although according to the above-described embodiment of the fabricating method, a description has been given to the spin coating process as a process of forming the ferroelectric layer, other than the spin coating process, the process can be carried out by vacuum deposition, a laser ablation process, MOCVD (Metal Organic Chemical Vapor Deposition), LSMCD (Liquid Source Misted Chemical Deposition) or a sputtering process.

Fifth Embodiment

Figure 9:
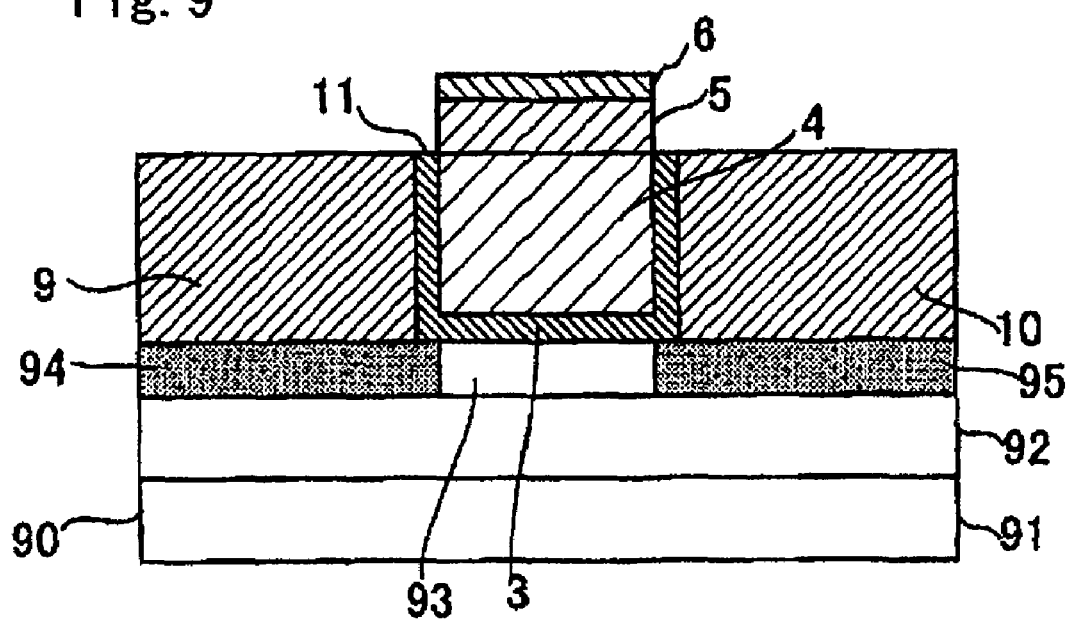
FIG. 9 is a sectional view showing a constitution of a semiconductor nonvolatile storage element according to a fifth embodiment of the invention.

Although according to the above-described first through fourth embodiments, a silicon (Si) semiconductor substrate is used, the embodiments can similarly be carried out also by an SOI (Silicon On Insulator) substrate. The embodiment is shown in FIG. 9. According to a fifth embodiment shown in FIG. 9, an SOI substrate 90 is used in place of the semiconductor substrate, and the substrate 90 is provided with an embedded oxide film 92 on a silicon (Si) substrate 91 to thereby form an insulating substrate. Further, there are formed a channel region 93, a source region 94 and a drain region 95 by a silicon (Si) semiconductor above the embedded oxide film 92. Other constitution is the same as that of the first embodiment explained in reference to FIG. 1 and accordingly, the same notations are attached to corresponding portions and an explanation thereof will be omitted.

Sixth Embodiment

Figure 10:
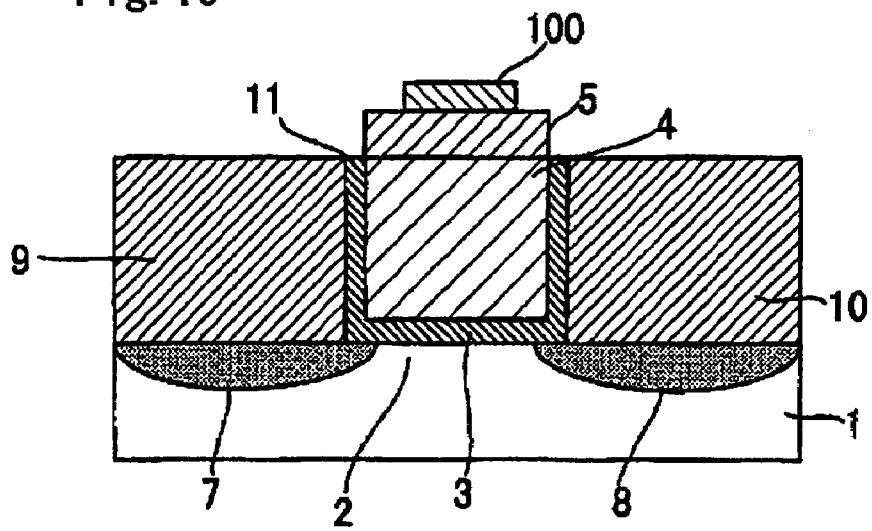
FIG. 10 is a sectional view showing a constitution of a semiconductor nonvolatile storage element according to a sixth embodiment of the invention.

Also in the first embodiment (FIG. 1), the second embodiment (FIG. 3), the third embodiment (FIG. 5), the fourth embodiment (FIG. 7) and the fifth embodiment (FIG. 9), mentioned above, similar to a sixth embodiment shown in FIG. 10, the effective area of the MFM structure can be reduced and the effective area of the MIS structure at the lower portion can be relatively increased by forming an area of a second conductor layer 100 above the ferroelectric layer 5 to be smaller than the area of the ferroelectric layer 5. Therefore, the coupling ratio ($C_I/(C_I+C_F)$) of the electrostatic capacitance $C_F$ of the capacitor of the MFM structure and the composite electrostatic capacitance $C_I$ of the capacitor of the MIS structure and the capacitor of the MIM structure, can be increased more than the conventional example without increasing the memory cell area.

Seventh Embodiment

Figure 11A:
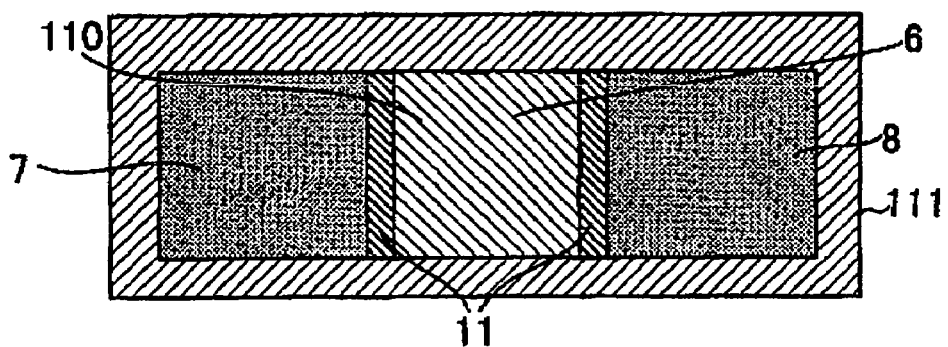
FIGS. 11A through 11C are plane views respectively showing an embodiment of arrangement of a second conductor layer of a semiconductor nonvolatile storage element according to a seventh embodiment of the invention.
Figure 11B:
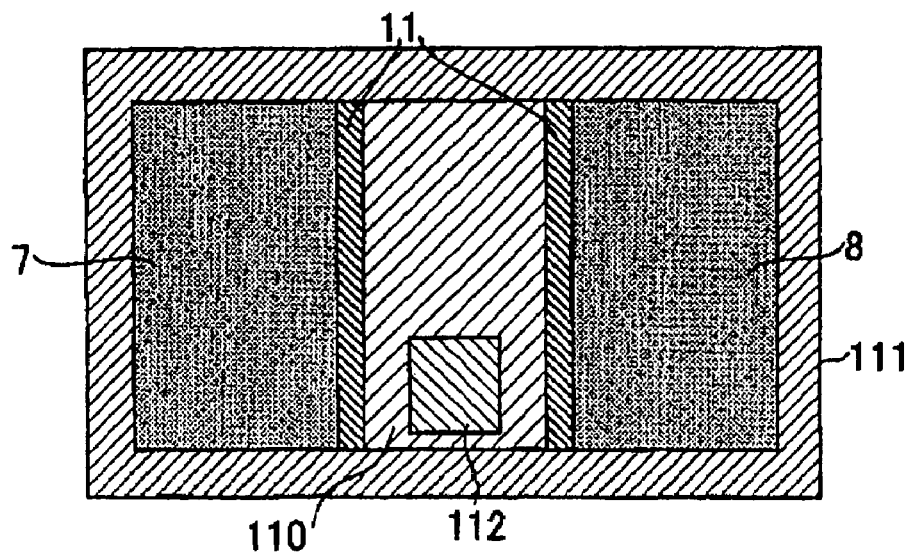
Figure 11C:
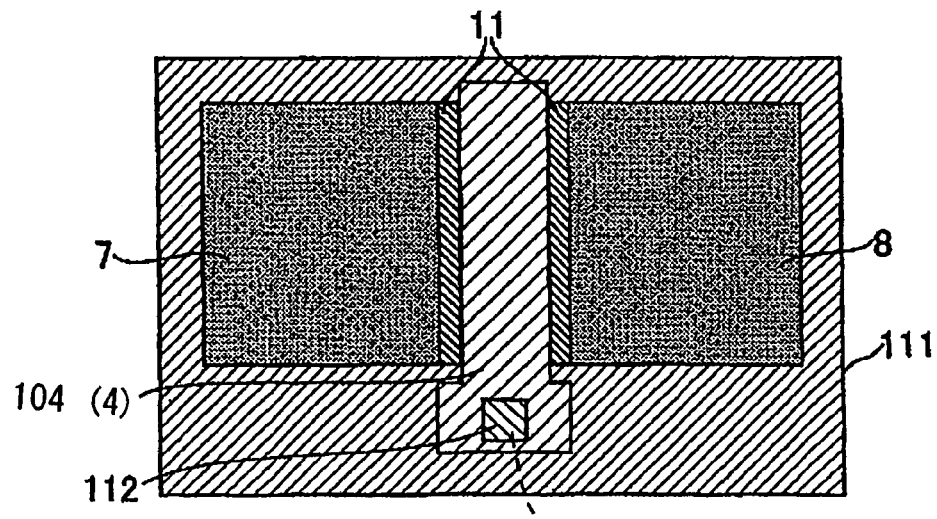
Figure 12A:
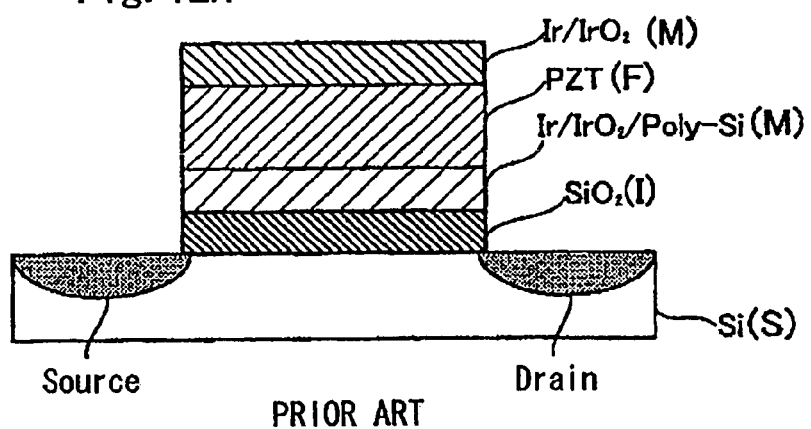
FIG. 12A is a sectional view of a semiconductor nonvolatile storage element having an MFMIS structure according to a conventional technology.
Figure 12B:
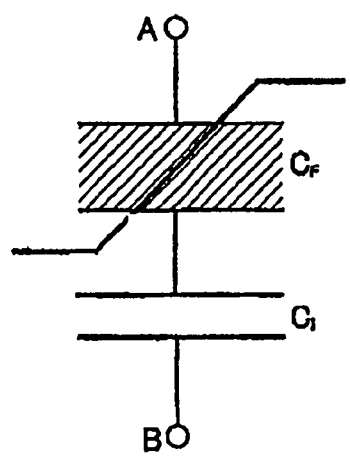
FIG. 12B is an equivalent circuit diagram of the semiconductor nonvolatile storage element having the MFMIS structure.
Figure 12C:
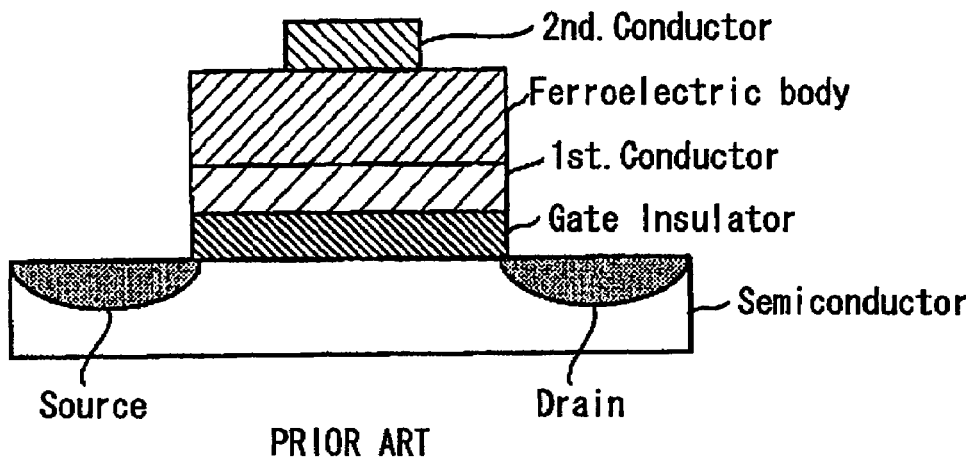
FIG. 12C is a sectional view of a semiconductor nonvolatile storage element having an MFMIS structure according to a conventional technology.
Figure 12D:
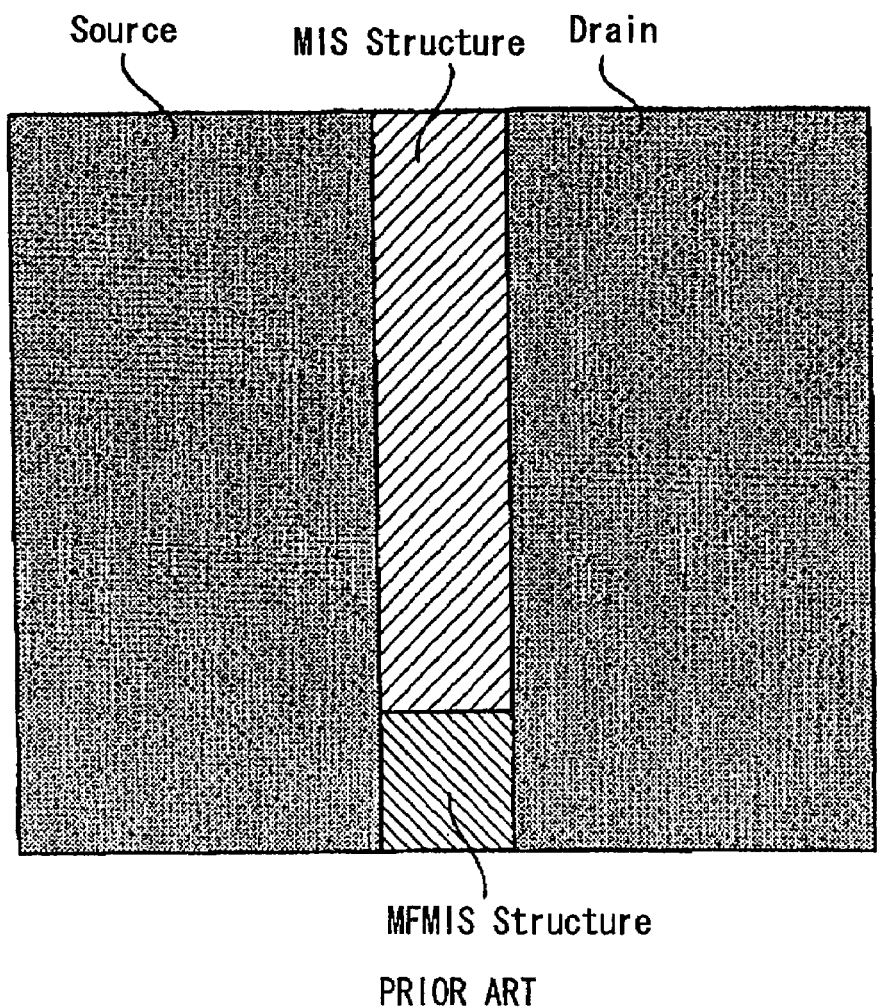
FIG. 12D is a plane view viewing the semiconductor nonvolatile storage element having the MFMIS structure according to the conventional technology from above.

The second conductor layer 6 or 100 constituting a contact to an upper electrode explained in the above-described embodiments, may not necessarily be disposed above a gate region 110 (shown in FIG. 11A or FIG. 11B) but may be disposed above an element isolating region 111 with no problem. Such an example is shown by a second conductor layer 112 of FIG. 11C as a seventh embodiment. When the second conductor layer 112 is formed above the ferroelectric layer 5, a gate electrode 104 formed of the first conductor 4, and the element isolating region 111 in this way, the degree of freedom of wiring is enhanced.

Eighth Embodiment

Figure 15A:
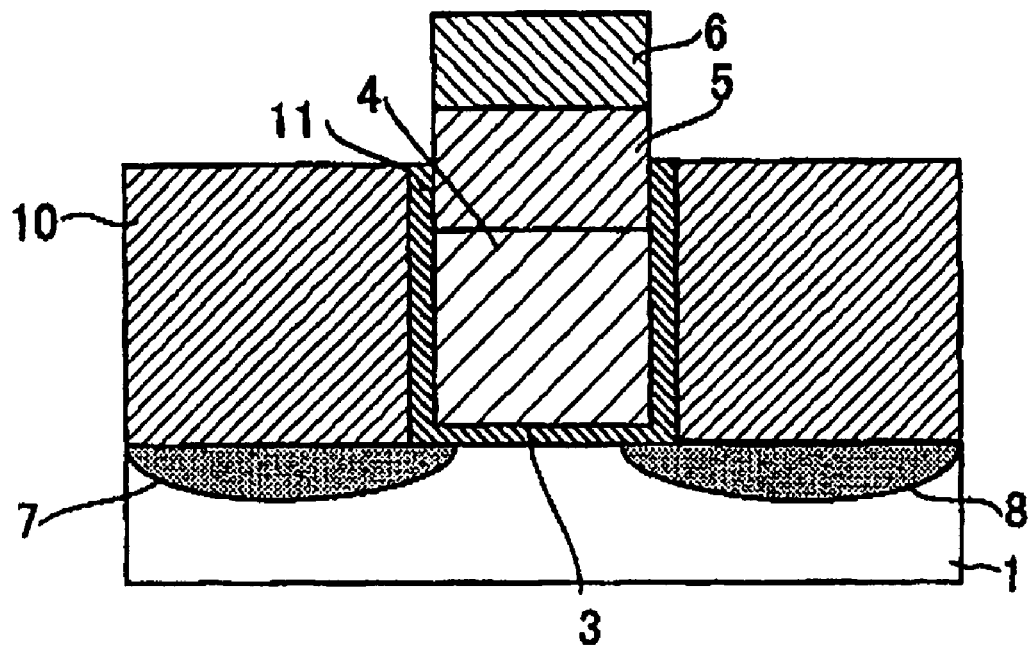
FIGS. 15A through 15C are sectional views showing a constitution of a semiconductor nonvolatile storage element according to an eighth embodiment of the invention.
Figure 15B:
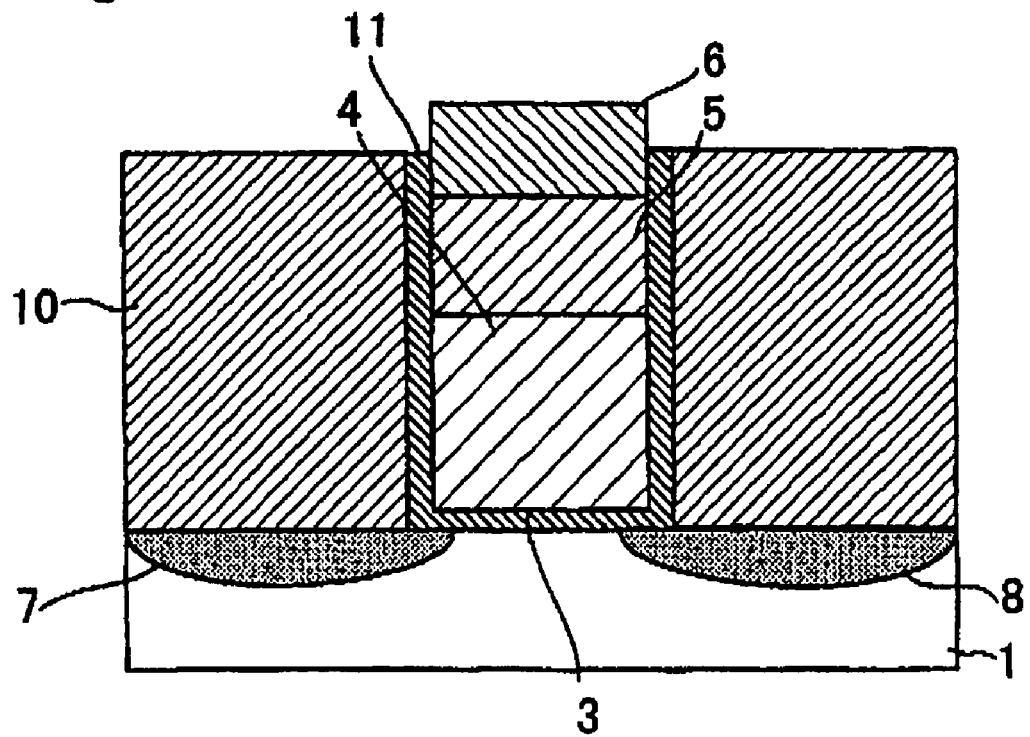
Figure 15C:
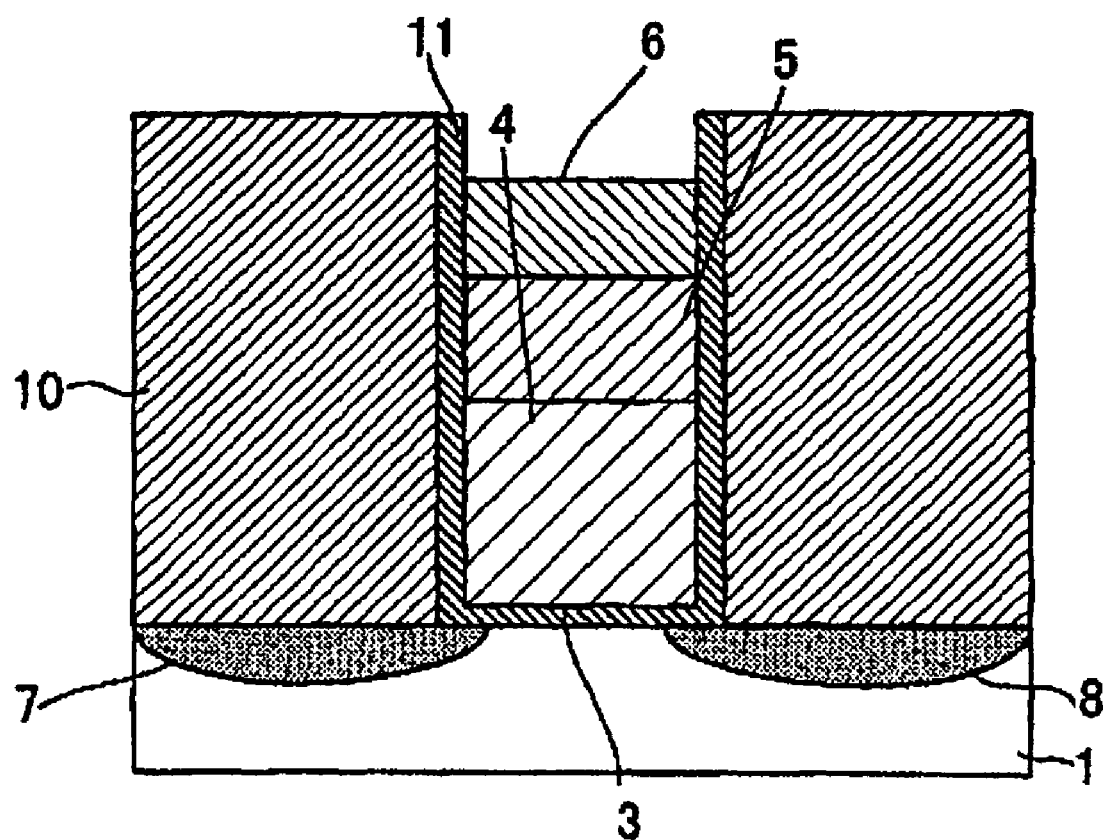

Although according to the above-described first through seventh embodiments, as shown by FIGS. 1 to 10, the upper faces of the third and the fourth conductors are disposed at a height same as the height of the upper face of the first conductor layer or disposed therebelow, as shown by FIGS. 15A, 15B and 15C, the upper faces of the third and the fourth conductors may be disposed above the upper face of the first conductor.

Further, the above-described embodiments are only exemplifying explanation of the invention and various correction or modification is self-evident for a person skilled in the art. For example, as the insulating film of the first insulator layer or the second insulator thin film described in the above-described embodiments, there can similarly be used a layer of one material selected from a group constituting of SiN (silicon nitride film), SiON (oxynitride silicon film), SiO$_2$—SiN (ON film: Oxide-Nitride), SiO$_2$—SiN—SiO$_2$ (ONO film: Oxide-Nitride-Oxide), Ta$_2$O$_5$ film, SrTiO$_3$ film, TiO$_2$ film, (Ba,Sr)TiO$_3$ film, Al$_2$O$_3$, ZrO$_2$, HfO$_2$, Y$_2$O$_3$, CeO$_2$, CeZrO$_2$, and YSZ (yttrium oxide stabilized zirconium oxide) other than silicon oxide (SiO$_2$). Further, a plurality of layers may be laminated.

Further, as the ferroelectric layer described in the above-described embodiments, there can similarly be used a layer of one material selected from a group constituting of PbTiO$_3$, PbZr$_x$Ti$_{1-x}$O$_3$, Pb$_y$La$_{1-y}$Zr$_x$Ti$_{1-x}$O$_3$, Bi$_4$Ti$_3$O$_{12}$, SrNbO$_7$, Pb$_5$Ge$_3$O$_{11}$ and Sr$_2$Ta$_x$Nb$_{1-x}$O$_7$ other than SBT.

According to the constitution of the invention, in the ferroelectric nonvolatile storage element including the field effect transistor, the second insulator thin films are interposed between the third and the fourth conductors of the source portion and the drain portion of the semiconductor substrate and the first conductor layer of the gate portion. By the constitution, the MIM structure is formed by the side walls of the third and the fourth conductors and the second insulating thin films and the first conductor layer and accordingly, the area of the total capacitor $C_I$ of the buffer layer connected in parallel with the MIS structure can be made larger than the area of the MFM capacitor. Therefore, the coupling ratio ($C_I/(C_I+C_F)$) of the electrostatic capacitance $C_F$ of the MFM capacitor to the composite electrostatic capacitance $C_I$ of the MIS capacitor and the MIM capacitor, can be increased without increasing the memory cell area as compared with the related art example and voltage can efficiently be applied to the ferroelectric capacitor. Further, integrated formation can be constituted with high density by reducing the memory cell area.

Further, before fabricating the ferroelectric thin film, the source and the drain regions and the side walls of the gate are not exposed and therefore, contamination from the ferroelectric body to silicon can be prevented. As a result, the highly reliable semiconductor nonvolatile storage element can be provided.

What is claimed is:

1. A semiconductor nonvolatile storage element, which is a ferroelectric nonvolatile storage element comprising:

a semiconductor substrate defining a source region, a drain region and a channel region between the source region and the drain region;

a first insulator layer extending over the entire channel region;

a first conductor layer formed on the first insulator layer and forming a gate over the channel region having a gate length extending in a direction from the source region to the drain region, the first conductor layer having first and second side walls;

a second insulator layer formed on the first conductor layer and including a second insulator first portion on the first side wall and a second insulator second portion on the second side wall;

a ferroelectric layer formed on the first conductor;

a second conductor layer formed on the ferroelectric layer;

the channel region, the first insulator layer and the first conductor layer forming a first capacitor which has an electrostatic capacitance C1;

the second conductor layer, the ferroelectric layer, and the first conductor layer forming a second capacitor which has an electrostatic capacitance C2;

a third conductor layer formed on the source region, and the second insulator first portion being provided between the third conductor layer and the first side wall of the first conductor layer such that the third conductor layer, the second insulator first portion and the first conductor layer form a third capacitor which has an electrostatic capacitance C3; and a fourth conductor layer formed on the drain region, and the third insulator second portion being provided between the fourth conductor layer and the second side wall of the first conductor layer such that the fourth conductor layer, the second insulator second portion and the first conductor layer form a fourth capacitor which has an electrostatic capacitance C4, wherein:

a composite capacitance CI=C1+C3+C4 and a coupling ratio (CI/(CI+C2)) is set such that distributed voltage is effectively applied to the second capacitor including the ferroelectric layer;

a distance from a bottom face of the first conductor layer to an upper face of the third conductor is greater than one tenth of said gate length;

a distance from the bottom face of the first conductor layer to an upper face of the fourth conductor is greater than one tenth of said gate length;

the second insulator first and second portions have a thickness in a direction normal the first and second side walls less than one tenth of said gate length; and $C_{MIS}$ equals C1, $C_{MIM}$ equals C3+C4, and $(C_{MIS}+C_{MIM})/C_{MIS}$ is equal to 2 or greater.

2. The semiconductor nonvolatile storage element according to claim 1, wherein the semiconductor substrate is an SOI substrate.

3. The semiconductor nonvolatile storage element according to claim 1, wherein an area of the second conductor layer above the ferroelectric layer is smaller than an area of the ferroelectric layer.

4. The semiconductor nonvolatile storage element according to claim 1, wherein each of the first insulator layer and the second insulator layer comprises a layer of one material selected from a group consisting of SiN (silicon nitride), SiON (silicon oxynitride), $SiO_2$—SiN (ON film: silicon oxide-silicon nitride), $SiO_2$—SiN—$SiO_2$ (ONO film: silicon dioxide-silicon nitride-silicon dioxide), $Ta_2O_5$, $SrTiO_3$, $TiO_2$, $(Ba,Sr)TiO_3$, $Al_2O_3$, $ZrO_2$, $HfO_2$, $Y_2O_3$, $CeO_2$, $CeZrO_2$ and YSZ (yttrium oxide stabilized zirconium oxide).

5. The semiconductor nonvolatile storage element according to claim 1, wherein the ferroelectric layer is a layer of one material selected from a group consisting of $SrBi_2Ta_2O_9$, $PbTiO_3$, $PbZr_xTi_{1-x}O_3$, $Pb_yLa_{1-y}Zr_xTi_{1-x}O_3$, $SrNbO_7$, $Pb_5Ge_3O_{11}$, and $Sr_2Ta_xNb_{1-x}O_7$.

6. The semiconductor nonvolatile storage element according to claim 1, wherein the first insulator layer the second insulator first and second portions form a U-shaped insulator.

7. The semiconductor nonvolatile storage element according to claim 6, wherein:

the semiconductor substrate, the first insulator layer and the first conductor layer form an MIS structure;

the third and fourth conductors have side walls extending in a direction from respective ones of the upper faces of said third and fourth conductors toward said semiconductor substrate which, in conjunction with side walls of the second insulator first and second portions and said first conductor layer, form an MIM structure; and an upper surface of the third and fourth conductors is higher above the semiconductor substrate than said first conductor layer.

8. The semiconductor nonvolatile storage element according to claim 1, wherein each of the first insulator layer and the second insulator layer comprises a laminated layer of two or more of materials selected from a group consisting of SiN (silicon nitride), SiON (silicon oxynitride), $SiO_2$—SiN— (ON film: silicon oxide-silicon nitride), $SiO_2$—SiN—$SiO_2$ (ONO film: silicon oxide-silicon nitride silicon oxide), $Ta_2O_5$, $SrTiO_3$, $TiO_2$, $(Ba,Sr)TiO_3$, $Al_2O_3$, $ZrO_2$, $HfO_2$, $Y_2O_3$, $CeO_2$, $CeZrO_2$ and YSZ (yttrium oxide stabilized zirconium oxide).

9. A semiconductor nonvolatile storage element, which is a ferroelectric nonvolatile storage element comprising:

a semiconductor substrate defining a source region, a drain region, a channel region between the source region and the drain region, and an element isolating region disposed outside and adjacent said channel region;

a first insulator layer extending over the entire channel region;

a first conductor layer formed on the first insulator layer and forming a gate over the channel region having a gate length extending in a direction from the source region to the drain region, said first conductor extending over said element isolating region, and the first conductor layer having first and second side walls;

a second insulator layer formed on the first conductor layer and including a second insulator first portion on the first side wall and a second insulator second portion on the second side wall;

a ferroelectric layer formed on the first conductor and disposed over said element isolating region; and a second conductor layer formed on the ferroelectric layer, said second conductor layer being disposed over said element isolating region;

the channel region, the first insulator layer and the first conductor layer forming a first capacitor which has an electrostatic capacitance C1;

the second conductor layer, the ferroelectric layer, and the first conductor layer forming a second capacitor which has an electrostatic capacitance C2;

a third conductor layer formed on the source region, and the second insulator first portion being provided between the third conductor layer and the first side wall of the first conductor layer such that the third conductor layer, the second insulator first portion and the first conductor layer form a third capacitor which has an electrostatic capacitance C3; and a fourth conductor layer formed on the drain region, and the third insulator second portion being provided between the fourth conductor layer and the second side wall of the first conductor layer such that the fourth conductor layer, the second insulator second portion and the first conductor layer form a fourth capacitor which has an electrostatic capacitance C4, wherein:

a coupling ratio (CI/(CI+C2)) of the C2 capacitance to the composite electrostatic capacitance CI(CI=C1+C3+C4) is set such that distributed voltage is effectively applied to the second capacitor including the ferroelectric layer;

a distance from a bottom face of the first conductor layer to an upper face of the third conductor is greater than one tenth of said gate length;

a distance from the bottom face of the first conductor layer to an upper face of the fourth conductor is greater than one tenth of said gate length; and the second insulator first and second portions have a thickness in a direction normal the first and second side walls less than said gate length.

10. The semiconductor nonvolatile storage element according to claim 9 wherein said second conductor is not disposed over said channel region.

11. The semiconductor nonvolatile storage element according to claim 10 wherein $C_{MIS}$ equals C1, $C_{MIM}$ equals C3+C4, and $(C_{MIS}+C_{MIM})/C_{MIS}$ is equal to 2 or greater.

12. The semiconductor nonvolatile storage element according to claim 11, wherein the first insulator layer and the second insulator first and second portions form a U-shaped insulator.

13. The semiconductor nonvolatile storage element according to claim 12, wherein:

the semiconductor substrate, the first insulator layer and the first conductor layer form an MIS structure;

the third and fourth conductors have side walls extending in a direction from respective ones of the upper faces of said third and fourth conductors toward said semiconductor substrate which, in conjunction with side walls of the second insulator first and second portions and said first conductor layer, form an MIM structure; and an upper surface of the third and fourth conductors is higher above the semiconductor substrate than said first conductor layer.

14. The semiconductor nonvolatile storage element according to claim 13 wherein:

a distance from a bottom face of the first conductor layer to an upper face of the third conductor is greater than one tenth of said gate length;

a distance from the bottom face of the first conductor layer to an upper face of the fourth conductor is greater than one tenth of said gate length; and the second insulator first and second portions have a thickness less than one tenth of said gate length.

15. The semiconductor nonvolatile storage element according to claim 9 wherein $C_{MIS}$ equals C1, $C_{MIM}$ equals C3+C4, and $(C_{MIS}+C_{MIM})/C_{MIS}$ is equal to 2 or greater.

16. The semiconductor nonvolatile storage element according to claim 15, wherein the first insulator layer and the second insulator first and second portions form a U-shaped insulator.

17. The semiconductor nonvolatile storage element according to claim 16, wherein:

the semiconductor substrate, the first insulator layer and the first conductor layer form an MIS structure;

the third and fourth conductors have side walls extending in a direction from respective ones of the upper faces of said third and fourth conductors toward said semiconductor substrate which, in conjunction with side walls of the second insulator first and second portions and said first conductor layer, form an MIM structure; and an upper surface of the third and fourth conductors is higher above the semiconductor substrate than said first conductor layer.

18. The semiconductor nonvolatile storage element according to claim 17 wherein:

a distance from a bottom face of the first conductor layer to an upper face of the third conductor is greater than one tenth of said gate length;

a distance from the bottom face of the first conductor layer to an upper face of the fourth conductor is greater than one tenth of said gate length; and the second insulator first and second portions have a thickness less than one tenth of said gate length.

* * * * *